United States Patent
Jo et al.

(10) Patent No.: US 8,129,840 B2
(45) Date of Patent: Mar. 6, 2012

(54) SEMICONDUCTOR PACKAGE AND METHODS OF MANUFACTURING THE SAME

(75) Inventors: Chajea Jo, Bucheon-si (KR); Uihyoung Lee, Seoul (KR); Jae-hyun Phee, Yongin-si (JP); Jeong-Woo Park, Suwon-si (KR); Ha-Young Yim, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 76 days.

(21) Appl. No.: 12/503,274

(22) Filed: Jul. 15, 2009

(65) Prior Publication Data
US 2010/0013094 A1    Jan. 21, 2010

(30) Foreign Application Priority Data
Jul. 15, 2008  (KR) .................................. 2008-68729

(51) Int. Cl.
*H01L 21/48* (2006.01)
(52) U.S. Cl. ........ 257/737; 257/734; 257/773; 257/678; 257/692; 257/E23.068
(58) Field of Classification Search .................. 257/692, 257/737, 773, 786, E32.021, E23.068
See application file for complete search history.

(56) References Cited

U.S. PATENT DOCUMENTS
4,113,578 A * 9/1978 Del Monte .................... 205/125
(Continued)

FOREIGN PATENT DOCUMENTS
JP    2000-174064    6/2000
(Continued)

OTHER PUBLICATIONS

Lau, J.H., Low Cost Flip Chip Technologies for DCA, WLCSP and PBGA Assemblies, McGraw-Hill, 2000, pp. 31-35.

(Continued)

*Primary Examiner* — Victor A Mandala
*Assistant Examiner* — William Harriston
(74) *Attorney, Agent, or Firm* — Stanzione & Kim, LLP

(57) ABSTRACT

A semiconductor package and a method of manufacturing the semiconductor package. The semiconductor package include a substrate including a plurality of pads and a plurality of bumps evenly disposed on an entire region of the substrate regardless of an arrangement of the plurality of pads. According to the present invention, a simplification of a process can be accomplished, a cost of a process can be reduced, reliability can be improved and an under-filling can become easy.

19 Claims, 20 Drawing Sheets

U.S. PATENT DOCUMENTS

| | | | | |
|---|---|---|---|---|
| 5,296,407 | A * | 3/1994 | Eguchi | 438/629 |
| 5,442,241 | A * | 8/1995 | Tane | 257/784 |
| 5,726,491 | A * | 3/1998 | Tajima et al. | 358/1.18 |
| 5,731,636 | A * | 3/1998 | Chun | 257/784 |
| 6,525,422 | B1 * | 2/2003 | Ono et al. | 257/737 |
| 6,650,016 | B1 * | 11/2003 | MacQuarrie et al. | 257/738 |
| 6,960,830 | B2 * | 11/2005 | Naiki | 257/738 |
| 7,005,741 | B2 * | 2/2006 | Ono et al. | 257/737 |
| 7,026,239 | B2 * | 4/2006 | Souriau et al. | 438/637 |
| 7,214,604 | B2 * | 5/2007 | Kim et al. | 438/613 |
| 7,355,286 | B2 | 4/2008 | Kim | |
| 7,358,174 | B2 * | 4/2008 | Mis | 438/612 |
| 7,563,703 | B2 * | 7/2009 | Brun et al. | 438/613 |
| 7,579,692 | B2 * | 8/2009 | Matsushima et al. | 257/738 |
| 2001/0013661 | A1 * | 8/2001 | Yamaguchi et al. | 257/778 |
| 2005/0090090 | A1 * | 4/2005 | Kim et al. | 438/613 |
| 2005/0208751 | A1 * | 9/2005 | Oh et al. | 438/614 |
| 2006/0113681 | A1 * | 6/2006 | Jeong et al. | 257/780 |
| 2006/0160270 | A1 * | 7/2006 | Brun et al. | 438/108 |
| 2007/0166978 | A1 * | 7/2007 | Brun et al. | 438/597 |

FOREIGN PATENT DOCUMENTS

| | | |
|---|---|---|
| JP | 2005-129955 | 5/2005 |
| JP | 2007-266564 | 10/2007 |
| KR | 2005-39230 | 4/2005 |
| KR | 10-0713932 | 4/2007 |

OTHER PUBLICATIONS

Lau, J.H./Pao, Y.H., Solder Jopint Reliability of BGA, CSP, Flip Chip and Fine pitch SMT Assemblies, McGraw-Hill, 1998, p. 53, pp. 249-296.

Lau, J.H., Chip on Board Technologies for Multichip Modules, Van Nostrand Reinhold, 1994, pp. 228-246.

* cited by examiner

SEMICONDUCTOR PACKAGE AND METHODS OF MANUFACTURING THE SAME

CROSS-REFERENCE TO RELATED APPLICATIONS

This U.S. non-provisional patent application claims priority under 35 U.S.C. §119 of Korean Patent Application No. 10-2008-0068729, filed on Jul. 15, 2008, the entire contents of which are herein incorporated by reference in their entirety.

BACKGROUND

1. Field of the Invention

The exemplary embodiments disclosed herein relate to semiconductor package and methods of manufacturing the same, and more particularly, to a semiconductor package having a general-purpose pillar bump and a method of manufacturing the same.

2. Description of the Related Art

A solder ball or a bump is generally used as a connection terminal to electrically connect a chip to a chip or a chip to a board when manufacturing a semiconductor package. A mask pattern corresponding with a design of a bonding pad should be formed to form a solder ball or a bump. Since a mask pattern should be differently manufactured according to a type of a device and a design of a bonding pad, and a process suitable for the mask pattern differently manufactured should be prepared, a bumping process becomes complicated, a cost of a process increases and a long time is required to develop a process. Thus, a method of manufacturing a semiconductor package which can simplify a bumping process may be required.

SUMMARY

Exemplary embodiments provide a semiconductor package. The semiconductor package may include a substrate including a pad and a plurality of bumps uniformly disposed on an entire region of the substrate regardless of a disposal of the pad.

Additional aspects and utilities of the present general inventive concept will be set forth in part in the description which follows and, in part, will be obvious from the description, or may be learned by practice of the general inventive concept.

Exemplary embodiments provide a semiconductor package. The semiconductor package may include a substrate including a plurality of pads and a unit bump group regularly repeated on an entire region of the substrate. The unit bump group may include a bump electrically connected to any one of the plurality of pads and a dummy bump electrically connected to none of the plurality of pads.

Exemplary embodiments provide a semiconductor package. The semiconductor package may include a first semiconductor device that a unit bump group including a bump electrically connected to a first substrate and a dummy bump not electrically connected to the first substrate is regularly repeated on an entire region of the first substrate, a second semiconductor device electrically connected to the first semiconductor device through the medium of the bump, and an under-filling layer filling a gap between the first and second semiconductor devices.

Exemplary embodiments provide a method of manufacturing a semiconductor package. The method may include providing a substrate, forming a mask pattern including a plurality of openings exposing a portion of the substrate, the plurality of openings being evenly disposed on an entire region of the substrate, and filling the plurality of openings with metal to form a plurality of bumps evenly disposed on an entire region of the substrate.

Exemplary embodiments provide a method of manufacturing a semiconductor package. The method may include providing a first semiconductor device including a first substrate including a plurality of first pads and a unit bump group including at least two bumps electrically connected to any one of the plurality of first pads and a dummy bump electrically connected to none of the first pads, the unit bump being evenly disposed on an entire region of the first substrate, providing a second semiconductor device including a plurality of second pads onto a second substrate, attaching any one of at least two the bumps among the unit bump group to any one of the plurality of second pads to connect the first and second semiconductor devices to each other, and forming an under-filling between the first and second semiconductor devices.

Exemplary embodiments provide a semiconductor package. The semiconductor package may include a substrate formed with one or more bonding pads, and a plurality of bumps spaced apart from each other, disposed on an area of one of the bonding pads, and electrically connected to the one bonding pad.

The semiconductor package may further include a plurality of second bumps spaced apart from each other, disposed in an area between the adjacent bonding pads, and formed not to be electrically connected to be the bonding pads.

The semiconductor package may further include a plurality of second bumps, the substrate may be formed with one or more protection layers formed between the adjacent bonding pads, and the second bumps may be disposed on an area of a corresponding protection layer.

The semiconductor package may further include a first metal layer disposed between the bonding pad and the corresponding bumps, and a second metal layer disposed between the protection layer and the corresponding second bump, and the first metal layer and the second metal layer may not be electrically connected to each other.

Exemplary embodiments provide an electronic apparatus having a semiconductor package. The electronic apparatus may include a function unit, a controller to control the function unit, and a semiconductor package disposed in one of the function unit and the controller, and having a substrate formed with one or more bonding pads, a plurality of bumps spaced apart from each other, disposed on an area of one of the bonding pads, and electrically connected to the one bonding pad and another bonding pad of the one of the function unit and the controller, and a plurality of second bumps spaced apart from each other and disposed another area other than an area of the bonding pads to support the semiconductor package and the one of the function unit and the controller.

Exemplary embodiments provide a method of manufacturing a semiconductor package. The method may include forming one or more bonding pads on a substrate, and forming a plurality of bumps to be spaced apart from each other, disposed on an area of one of the bonding pads, and electrically connected to the one bonding pad.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1A:
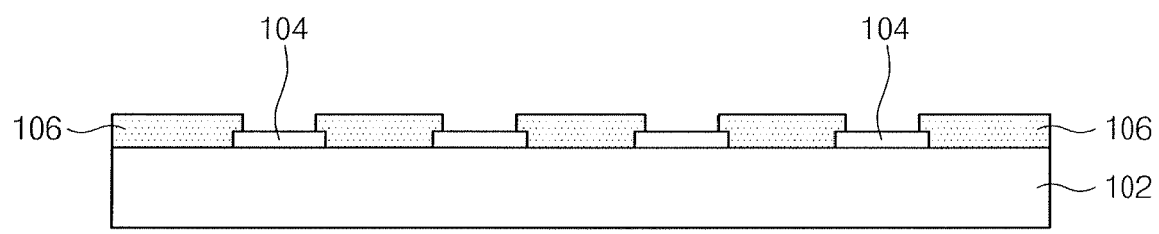
FIGS. 1A through 1F are cross sectional views illustrating a method of manufacturing a semiconductor package according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms, first, second, etc., may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present general inventive concept may be described with reference to cross-sectional illustrations, which are schematic illustrations of idealized embodiments of the present general inventive concept. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present general inventive concept.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

FIGS. 1A through 1F are cross sectional views illustrating a method of manufacturing a semiconductor package according to an embodiment of the present general inventive concept.

Referring to FIG. 1A, a substrate 102 is prepared. The substrate 102 may be a wafer-level substrate or a chip-level substrate. A circuit pattern may be formed on the substrate 102. A bonding pad 104 electrically connected to a circuit pattern and a protection layer 106 exposing a portion of the bonding pad 104 are formed on the substrate 102. The bonding pad 104 may be a redistributed interconnection and may be mainly disposed on a center or an edge of the substrate 102. For example, the bonding pad 104 may be formed of aluminum (Al) and the protection layer 106 may be formed of a nitride layer, an oxide layer or a polyimide. The term of the redistributed interconnection of a semiconductor package is referred to as a structure of a conductive line to connect one or more circuit units of one or more semiconductor chips to each other or to a circuit of an external device.

Figure 1B:
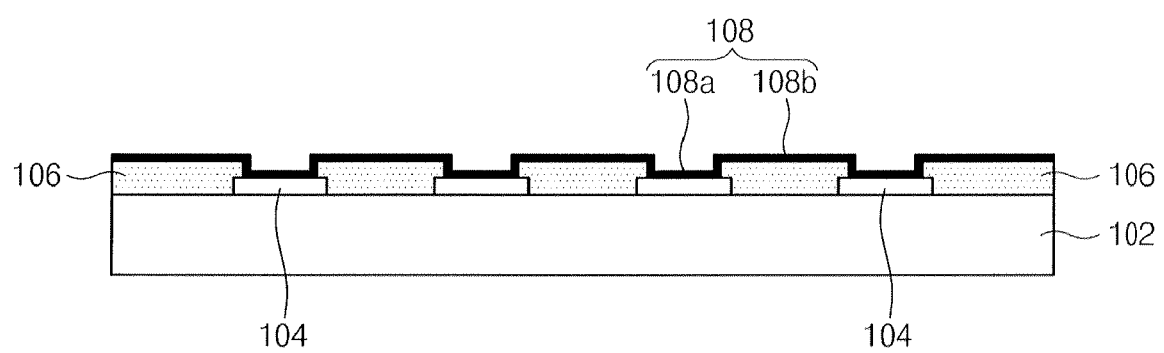

Referring to FIG. 1B, a metal layer 108 may be formed on an entire surface of the substrate 102. The metal layer 108 may be formed on surfaces of the bonding pads 104 and the protection layer 106. The metal layer 108 may be an under bump metallurgy (UBM) which functions as an adhesive layer, a diffusion prevention layer and a wetting layer. The metal layer 108 may be formed to be a multi-layer structure by depositing various metals, such as chrome (Cr), copper (Cu), nickel (Ni), titanium-tungsten (TiW), nickel-vanadium (NiV) and so on, using a sputtering method. For example, the metal layer 108 may be formed of a Cr/Cr—Cu/Cu structure, a TiW/Cu structure, an Al/NiV/Cu structure or a Ni/Au structure. The metal layer 108 may be divided into a first metal layer 108a covering the bonding pad 104 and a second metal layer 108b covering the protection layer 106.

Figure 1C:
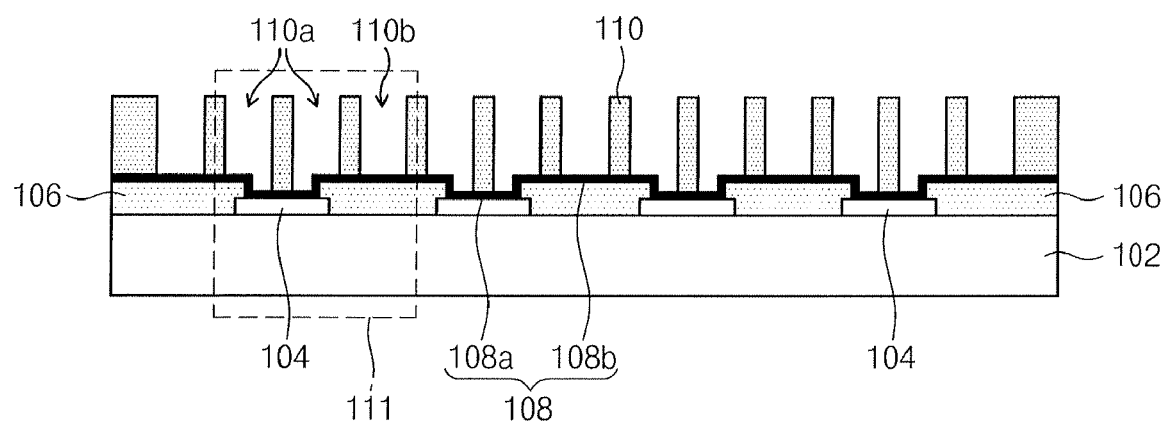

Referring to FIG. 1C, a mask pattern 110 is formed on the metal layer 108. The mask pattern 110 may, for example, be formed by depositing and patterning a photoresist. A material of the mask pattern 110 is not limited to a photoresist and the mask pattern 110 may be formed of an oxide layer or a nitride layer. Regardless of an arrangement of the bonding pad 104, the mask pattern 110 may be formed over an entire region of the substrate 102 and may have a shape that a specified pattern is repeated. For example, the mask pattern 110 includes a unit pattern 111 including at least two first openings 110a to expose the first metal layer 108a and at least one second opening 110b to expose the second metal layer 108b. The unit pattern 111 may be repeatedly formed on an entire region of the substrate 102. The unit patterns 111 may be disposed to be spaced apart from each other by an interval or one or more interval. A shape of the unit pattern 111 is not limited thereto described above and may be variously changed.

Since the bonding pad 104 is a position where a probe is in contact when performing an electrical test or a reliability test of a chip, the bonding pad 104 should have a certain size of some extent, in a direction, for example, parallel to a plane on which the entire surface of the substrate 102 is disposed. Accordingly, since a size of the bonding pad 104 may be relatively great compared to the openings 110a and 110b, the unit pattern 111 can have at least two first openings 110a to expose the first metal layer 108a. The openings 110a and 110b may have a shape, for example, a cylinder, a square pillar or the like.

Figure 1D:
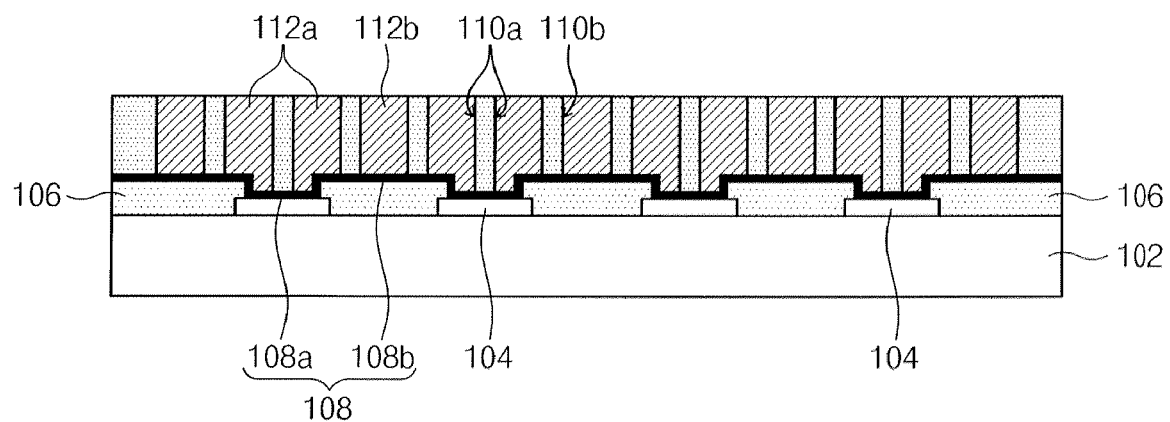

Referring to FIG. 1D, a plating layer 112 is grown (formed) using an electroplating method of taking the metal layer 108 as a seed layer to fill the openings 110a and 110b. The plating layer 112 may be formed of various metals such as nickel (Ni), copper (Cu), palladium (Pd), platinum (Pt), gold (Au) or combinations thereof. The plating layer 112 may include a first plating layer 112a filling the first opening 110a and a second plating layer 112b filling the second opening 110b.

Figure 1E:
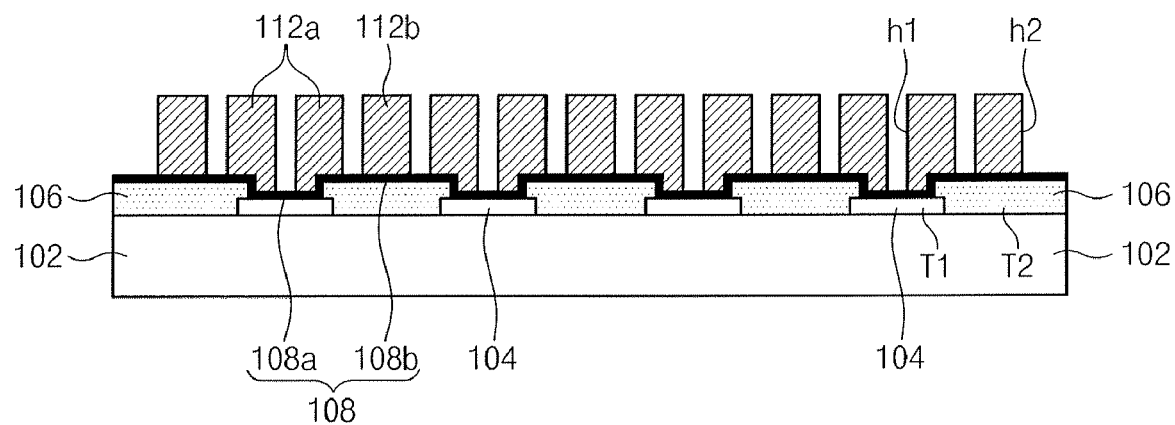

Referring to FIG. 1E, the mask pattern (110 of FIG. 1D) is removed. When the mask pattern 110 is formed of a photoresist, for example, the mask pattern 110 is removed using an ashing process; when the mask pattern 110 is formed of an oxide layer or a nitride layer, for example, the mask pattern 110 is removed using a wet etching or dry etching. A plurality of the first plating layers 112a and a plurality of the second plating layers 112b each having a pillar shape may be remained on the substrate 102 by removing the mask pattern 110.

Figure 1F:
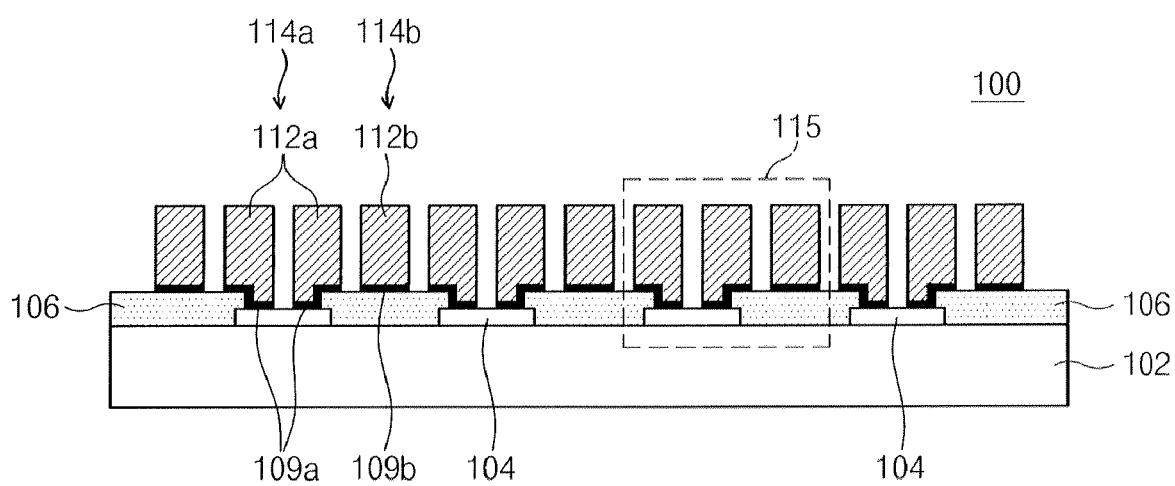

Referring to FIG. 1F, the metal layer (108 of FIG. 1E) that is not covered by the plating layer 112a and 112b is removed using a wet etching or a dry etching. As a result, a first lower metal layer 109a is remained under the first plating layer 112a and a second lower metal layer is remained under the second plating layer 112b. When the substrate 102 is a wafer-level substrate, for example, a process of sawing the substrate 102 may be additionally formed.

A unit bump group 115 includes a first bump 114a having the first plating layer 112a and the first lower metal layer 109a, and a second bump 114b having the second plating layer 112b and the second lower metal layer 109b and regularly or repeatedly formed on an entire region of the substrate 102 using the electroplating method. The unit bump groups 115 may be disposed to be spaced apart from each other by an interval or one or more interval. At least two adjacent first bumps 114a may be electrically connected to one pad 104 in common. A plurality of the bumps 114a and 114b are uniformly arranged at regular pitches on an entire region of the substrate 102 and may be more minutely and more densely disposed compared with an arrangement of a plurality of bonding pads 104. That is, positions (areas) of the one or more bumps 114a and 114b may overlap a position of a bonding pad 104.

The number of the first bumps 114a or the number of the first plating layers 112a may be different from the number of the bonding pads 104. One or more first bumps 114a or one or more first plating layers 112a may correspond to one bonding pad 104. At least one second bump 114b or at least one second plating layer 112b is formed on a region of the protection layer 106. At least one of the first plating layer 112a may have an area to overlap an area of the first lower metal layer 109a.

Referring to FIG. 1E, the plating layer 112 may have a same height from the substrate 104. However, the first plating layer 112a may have a height h1 which is different from a height h2 of the second plating layer 112b with respect to the bonding pad 104 and the protection layer 106, respectively. The bonding pad 104 may have a thickness T1 and the protection layer 106 may have a thickness T2 different from the thickness T2. However, it is possible that the height h1 may be the same as the height h2. It is also possible that the thickness T1 may be the same as the thickness T2. As described above, the plating layer 112 may have a first end to contact the bonding pad 104 and/or the protection layer 106 and a second end extended from the first end away from the first end to have a corresponding height. The second ends of the plating layer 112 may be disposed on a plane parallel to, for example, a major surface (or entire surface contacting the bonding pad 104 and the protection layer 106) of the substrate 102.

Figure 9A:
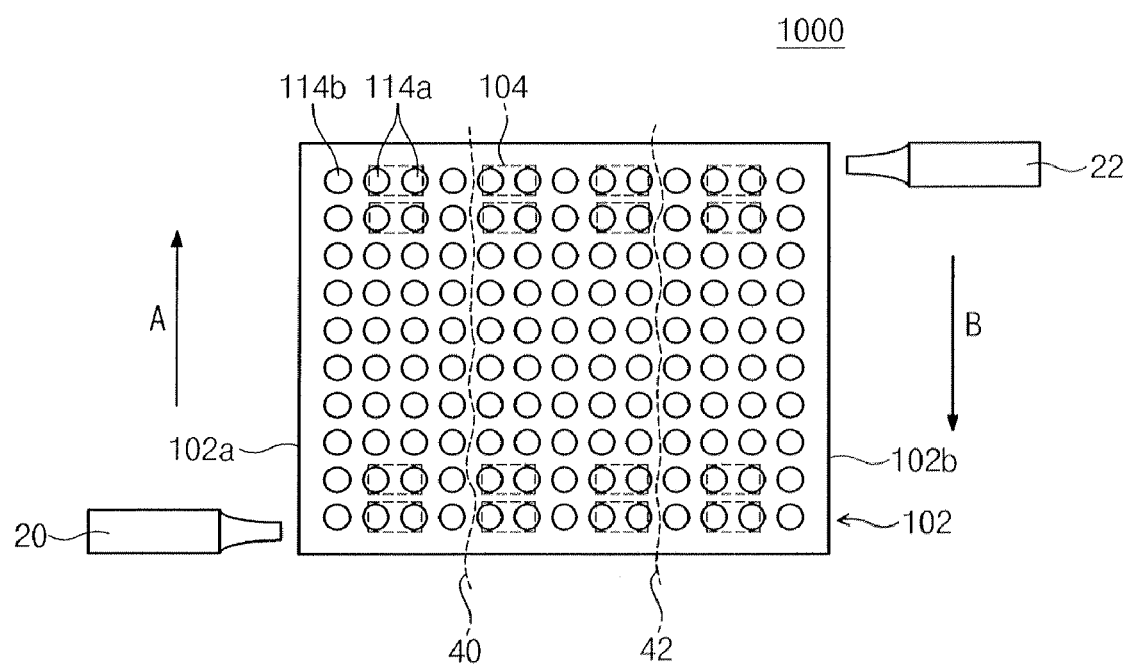
FIG. 9A is a top plane view of an under-filling process according to an embodiment of the present general inventive concept.

A plane arrangement of a plurality of the bumps 114a and 114b is depicted in FIG. 9A in detail.

The first bump 114a is a bump or conductive bump to be electrically connected to the bonding pad 104 and used as an electrical connection terminal to be electrically connected to an external device. The second bump 114b is a dummy bump which is not electrically connected to the bonding pad 104 even through the metal layer 108b. In the present embodiment, since the second bump 114b functions as a dummy, it is no necessary to additionally form a dummy bump.

Figure 2A:
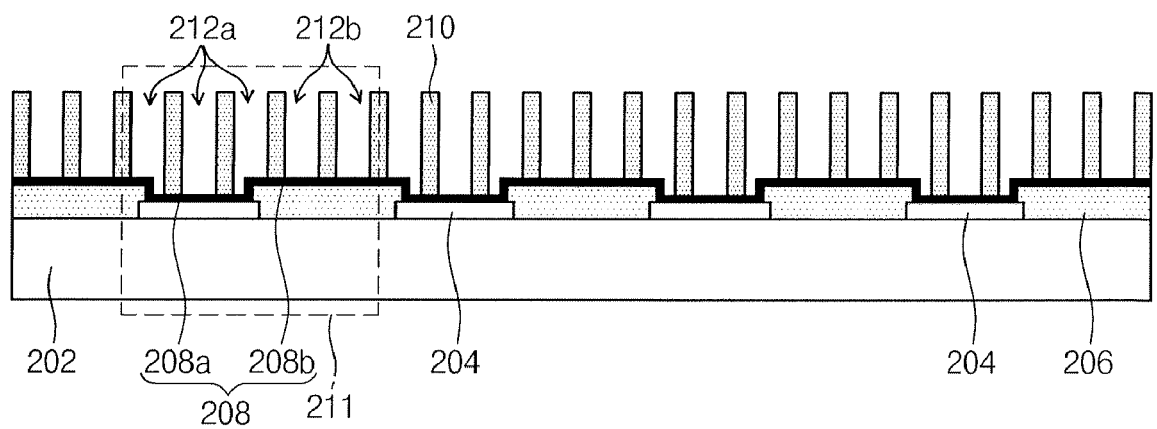
FIGS. 2A and 2B are cross sectional views illustrating a method of manufacturing a semiconductor package according to an embodiment of the present general inventive concept.
Figure 2B:
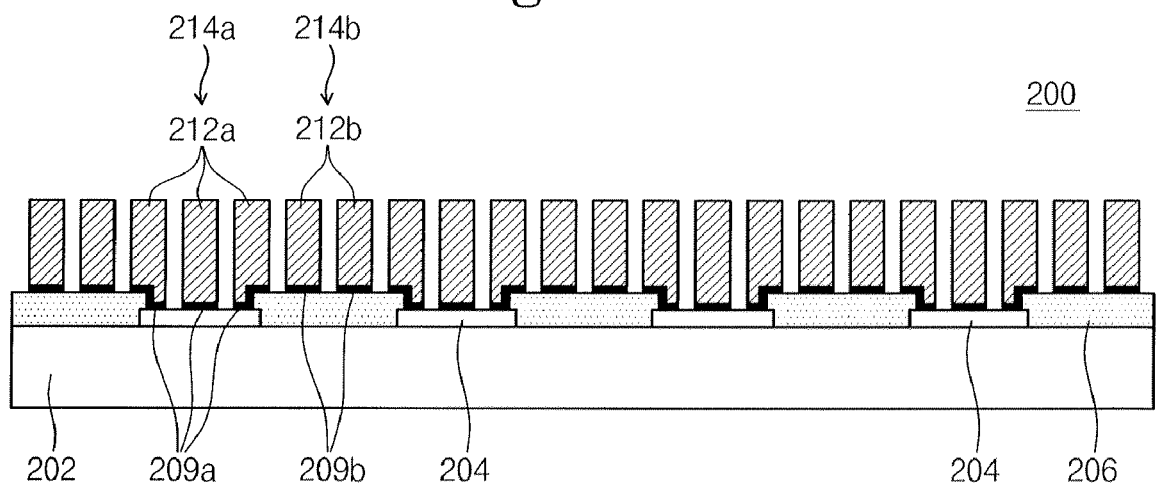
Figure 2C:
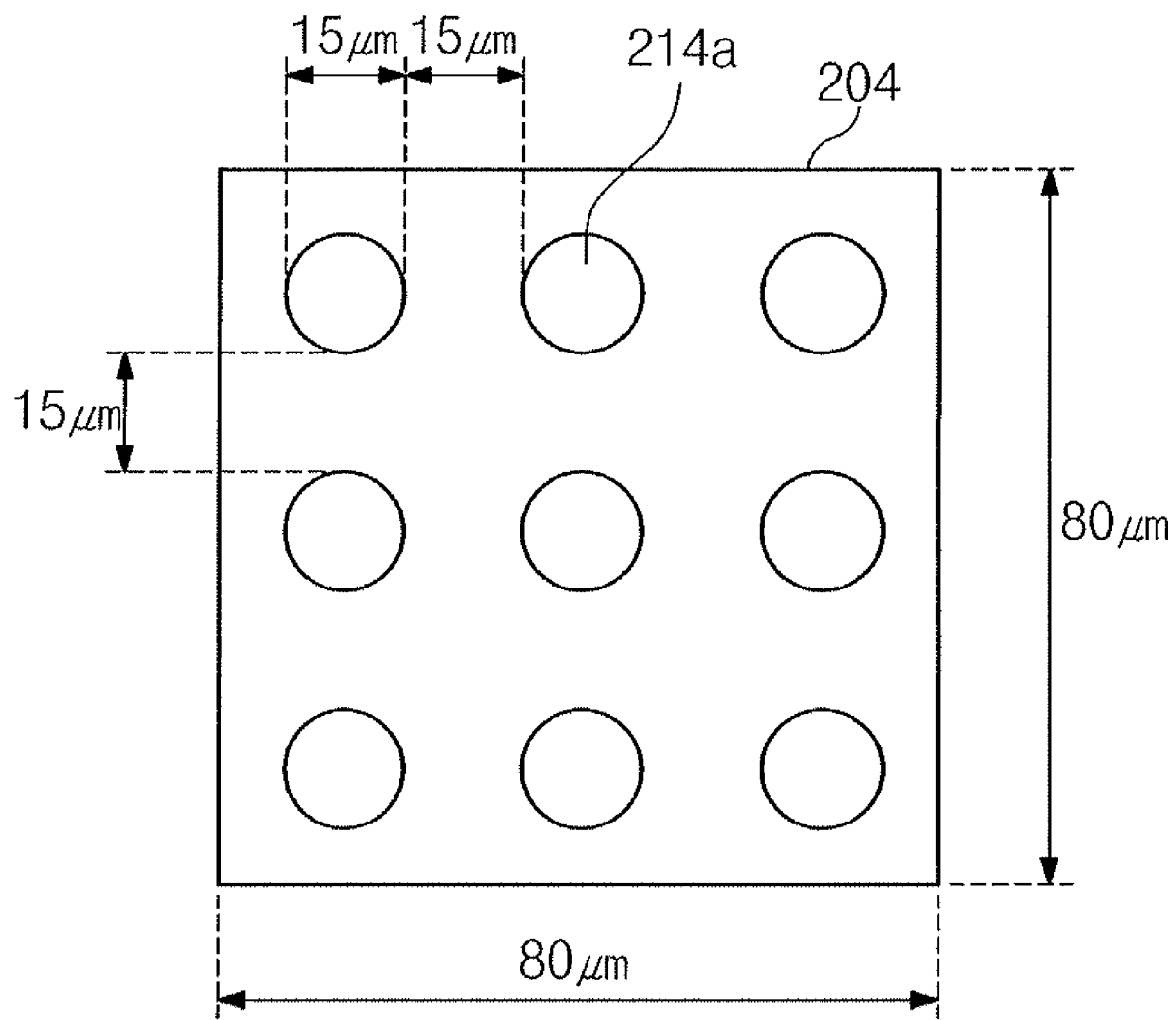
FIG. 2C is a plan view of FIG. 2B.

FIGS. 2A and 2B are cross sectional views illustrating a method of manufacturing a semiconductor package according to an embodiment of the present general inventive concept. FIG. 2C is a top view of FIG. 2B. The description of common features already discussed in the embodiment of FIGS. 1A through 1F will be omitted for brevity.

Referring to FIG. 2A, a substrate 202 on which a metal layer 208 including a first metal layer 208a and a second layer 208b and a protection layer 206 exposing a portion of the bonding pad 204 are formed is prepared by performing a process similar to or identical to the process described referring to FIGS. 1A through 1C. However, the present general inventive concept is not limited thereto. A different process may be used to form the substrate 202 with the above-described layers.

A mask pattern 210 is formed on the substrate 202. For example, the mask pattern 210 may have a shape that a unit pattern 211 including at least three first openings 210a exposing the first metal layer 208a and at least two second openings 212b to expose the second metal layer 208b is regularly and/or repeatedly formed on an entire region of the substrate 202.

Referring to FIG. 2B, a process similar to or identical to the process described referring to FIGS. 1D through 1F may be performed. Accordingly, a semiconductor package 200 may be manufactured. The semiconductor package 200 may include a plurality of first bumps 214a having a first lower metal layer 209a and a first plating layer 212a, and a plurality of second bumps 214b having a second lower metal layer 209b and a second plating layer 2112b. The first bump 214a may be electrically connected to a bonding pad 204 so that the first bump 214a may function as an electrical interconnection terminal to be connected to an external device such that the bonding pad 204 can communicate with the external device to transmit and receive data or signal. Although the first bump 214a is formed as the electrical interconnection, the second bump 214b may not be electrically connected to the bonding pad 204 so that the second bump 214b may function as a dummy electrical interconnection terminal disposed between the substrate 202 and the external device as a support therebetween.

The number of the unit patterns 211 may be variable according to an available minimum design that a process can embody. The number and an arrangement of the first bump 214a can be changed according to a user demand. As illustrated in FIG. 2C, if a size of the bonding pad 204 is 80 μm×80 μm and a distance between the first bumps 214a having cylindrical shape is about 15 μm, about 9 first bumps 214a may be formed in one boding pad 204.

Accordingly, areas of a plurality of first bumps 212a may be disposed in an area of the bonding pad 204. That is, areas of the one or more first bumps 212a may overlap the area of the bonding pad 204. The area of the first bump 212a may be disposed on the boding pad 204 and/or the protection layer 206.

The first bumps 212a may have a pattern, and the bonding pads 204 may have a pattern different from the pattern of the first bumps 212a. The second bumps 212b may have a pattern different from the pattern of the first bumps 212a. When a first number of the bonding pads 204 are formed on the substrate 202, a second number of the first bumps 212a are formed in the semiconductor package, and the second number is greater than the first number. When there is the number of the first bumps 212a, the number of the second bumps 212b may be different from the first bumps 212b. The number of the first bumps 212a may be greater than the number of the second bumps 212b.

The metal layer 208 may have a thickness. The first metal layer 208a may have a thickness different from a thickness of the second metal layer 208b. However, it is possible that as described above with reference with FIG. 1E, the second ends of the first bumps 212a and the second bumps 211b may be disposed on a plane parallel to the surface of the substrate 102.

FIGS. 3A through 3D are cross sectional views illustrating a method of manufacturing a semiconductor package according to an embodiment of the present general inventive concept. The description of common features already discussed in the embodiment of FIGS. 1A through 1F or 2A through 2C will be omitted for brevity.

Figure 3A:
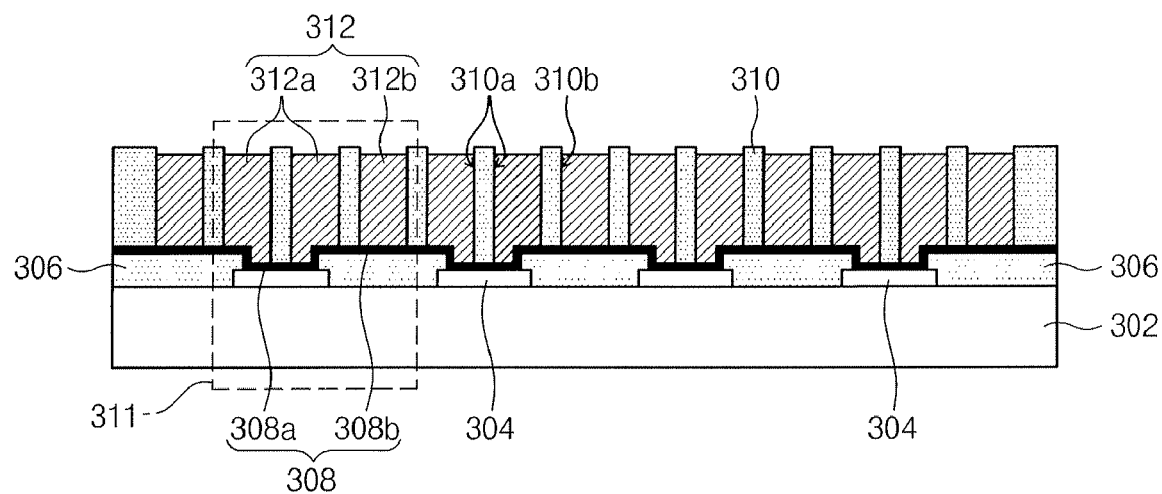
FIGS. 3A through 3D are cross sectional views illustrating a method of manufacturing a semiconductor package according to an embodiment of the present general inventive concept.

Referring to FIG. 3A, a substrate 302 is formed with a bonding pad 304, a protection layer 306 to expose at least a portion of the bonding pad 304, and a metal layer 308 which includes a first metal layer 308a and a second metal layer 308b. The above elements may be formed according a process similar to the process illustrated in FIGS. 1A-1F. Therefore, detailed descriptions will be omitted.

A mask pattern 310 that a unit pattern 311 is repeatedly formed on an entire region of the substrate 302 at regular intervals is formed on the substrate 302. For example, the unit pattern 311 may include at least two first openings 310a to expose the first metal layer 308a and at least one second opening 310b to expose the second metal layer 308b. The unit pattern 311 may be a shape similar to or identical to the unit pattern 211 of FIG. 2A.

A plating layer 312 is grown (formed) using an electroplating method using the metal layer 308 as a seed to fill the openings 310a and 310b. The plating layer 312 can fill an entire portion of the openings 310a and 310b or a portion of the openings 310a and 310b. The plating layer 312 can include a first plating layer 312a filling the first opening 310a and a second plating layer 312b filling the second opening 310b.

The mask pattern 310 may have a height from the substrate 302, and the plating layer 312 may have a height shorter than the height of the mask pattern 310. The first plate layer 312a may have a height (length) form the substrate and the second plate layer 312b may have a height (length) shorter than the height (length) of the first plate layer 312a. The first plate layer 312a may have one end to contact the bonding pad 304 and the protection layer 306. The end of the first plate layer 312a may have a first portion to contact the bonding pad 304 and a second portion to contact the protection layer 306. The first portion of the first plate layer 312a may have a length longer than a length of the second portion since thicknesses of the bonding pad 304 and the protection layer 306 are different from each other.

The plate layers 312 are spaced apart from each other by a distance, and have a width narrower than the distance between the adjacent plate layers 312 in a direction parallel to a plane on which a surface of the substrate 302 is disposed to face the bonding pad 304 and the protection layer 306. The distance between the adjacent first plate layers 312a is narrower than a width of the bonding pad 304 such that at least two of the first plate layers 312a can be formed to contact the bonding pad 304 through the metal layer 308.

Figure 3B:
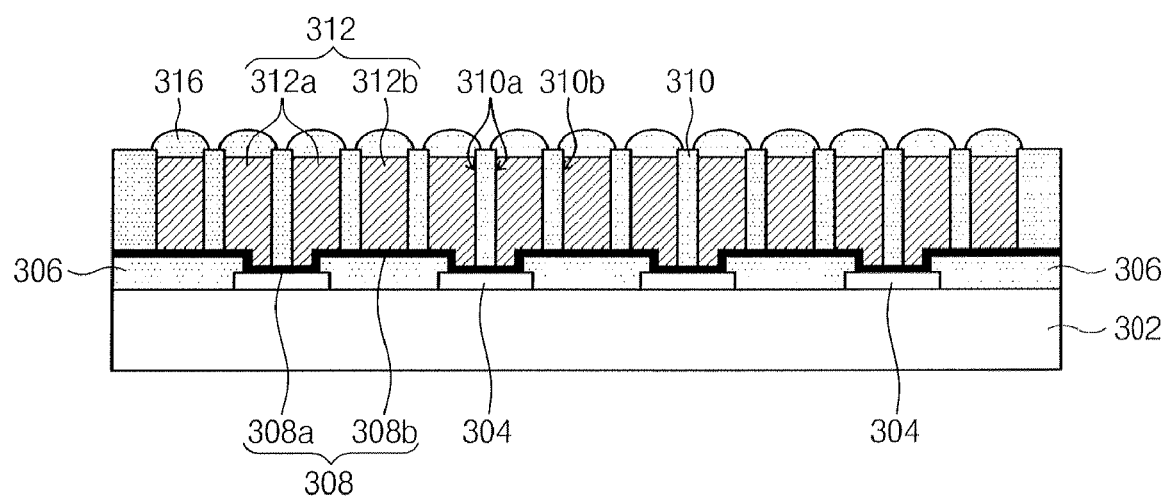

Referring to FIG. 3B, a solder paste 316 is formed on the plating layer 312. For example, the solder paste 316 may be formed using a stencil process as will be described referring to FIGS. 5A through 5C. In this case, another mask pattern may be further required to form the solder paste 316. However, as illustrated in FIG. 3A, when the plating layer 312 fills only a portion of the openings 310a and 31b, (i.e., a lower portion), the mask pattern 310 may be used as a mask pattern to form the solder paste 316. The solder paste 316 may be formed using a process similar to a process of an ink jet print.

Figure 3C:
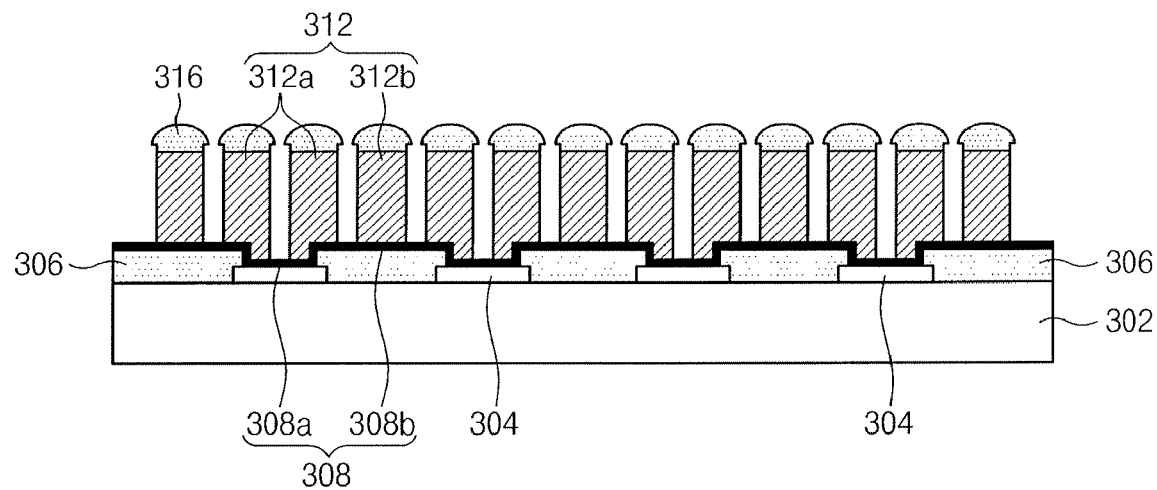

Referring to FIG. 3C, the mask pattern (310 of FIG. 3B) is removed. As a result, the plating layer 312 on a top surface of which the solder paste 316 of a shape, for example, a mushroom shape, is formed may be arranged on an entire region of the substrate 312.

Although a number of the solder paste 316 are formed on the entire region of the substrate 312, it is possible that a number of the solder paste 316 may be formed in a predetermined area of the substrate. It is also possible that the solder paste 316 may be disposed to form a pattern over the entire region of the substrate 312. The number of the solder pastes 316 is greater than the number of the bonding pads 304.

Figure 3D:
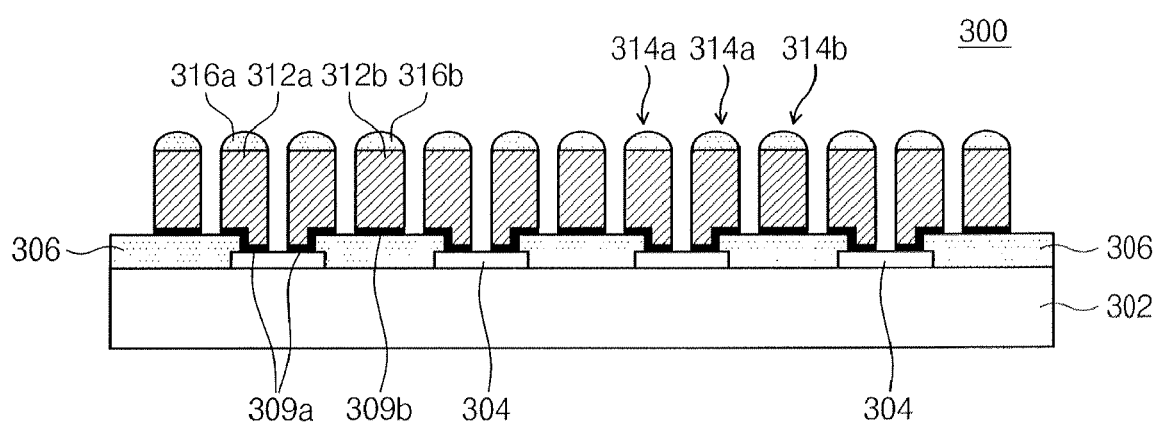

Referring to FIG. 3D, a reflow of the solder paste (316 of FIG. 3C) is performed to form a solder 316a and 316b of a shape, for example, a hemispherical shape. Alternatively, the solder paste 316 of a mushroom shape can be changed to almost a spherical shape by a reflow process. The solder 316a and 316b may include a first solder 316a located on the first plating layer 312a and a second solder 316b located on the second plating layer 312b The metal layer (308 of FIG. 3C) not covered with the first plating layer 312a and the second plating layer 312b is removed by an etching process. As a result, a first lower metal layer 309a is remained on the first plating layer 312a and a second lower metal layer 309b is remained on the second plating layer 312b. The reflow process and the etching process mentioned above have no limitation on a proceeding order. Thus, the etching process may be performed after or before the reflow process.

According to the above-mentioned processes, a semiconductor package 300 including a first bump 314a electrically connected to the bonding pad 304 and a second bump 314b not electrically connected to the bonding pad 304 may be provided. The first bump 314a may include the first lower metal layer 309a, the first plating layer 312a and the first solder 316a that are sequentially stacked. The second bump 314b may include the second lower metal layer 309b, the second plating layer 312b and the second solder 316b that are sequentially stacked. The first and second bumps 314a and 314b may be uniformly disposed on an entire region of the substrate 302.

The number and an arrangement of the first bump 314a electrically connected to the bonding pad 304 may be changed. For example, the first bump 314a may be formed to have the same number and arrangement as those in FIG. 2C. The solders 316a and 316b may be applied to not only the second embodiment described above but also other embodiments described later.

The bumps 314a and 314b may be a conductive plate attached to the metal plate 312 may be a metal paste. Metal may include gold (Au), tin (Sn), nickel (Ni), silver (Ag), copper (Cu), bismuth (Bi) and so on.

FIGS. 4A through 4E are cross sectional views illustrating a method of manufacturing a semiconductor package according to an embodiment of the present general inventive concept. The description of common features already discussed in the embodiment of FIGS. 1A through 3D will be omitted for brevity.

Figure 4A:
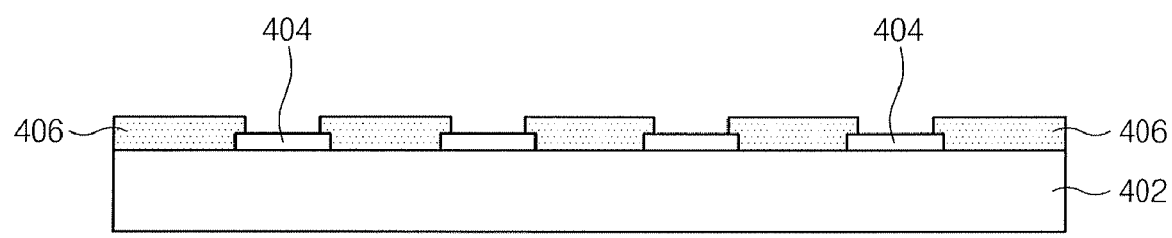
FIGS. 4A through 4E are cross sectional views illustrating a method of manufacturing a semiconductor package according to an embodiment of the present general inventive concept.

Referring to FIG. 4A, a substrate 402 on which a bonding pad 404 is prepared. A protection layer 406 is formed on the substrate 402 to expose at least a portion of the bonding pad 404.

Figure 4B:
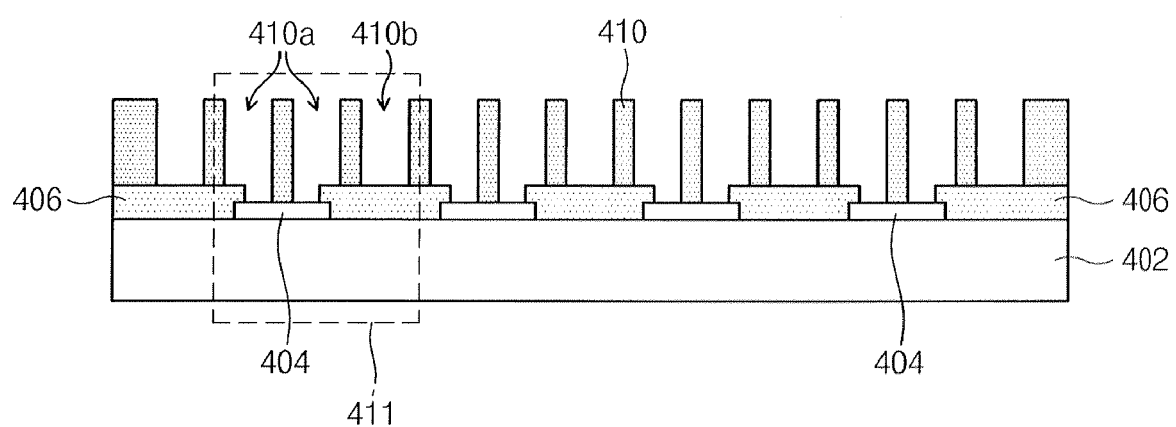

Referring to FIG. 4B, a mask pattern 410 that a unit pattern 411 is regularly and/or repeatedly formed or disposed on (over) an entire region or a predetermined region of the substrate 402 is formed on the substrate 402. For example, the unit pattern 411 may include at least two first openings 410a to expose the bonding pad 404 and at least one second opening 410b to expose the protection layer 406. The unit pattern 411 may be similar to or identical to the unit pattern 211 of FIG. 2A.

Figure 4C:
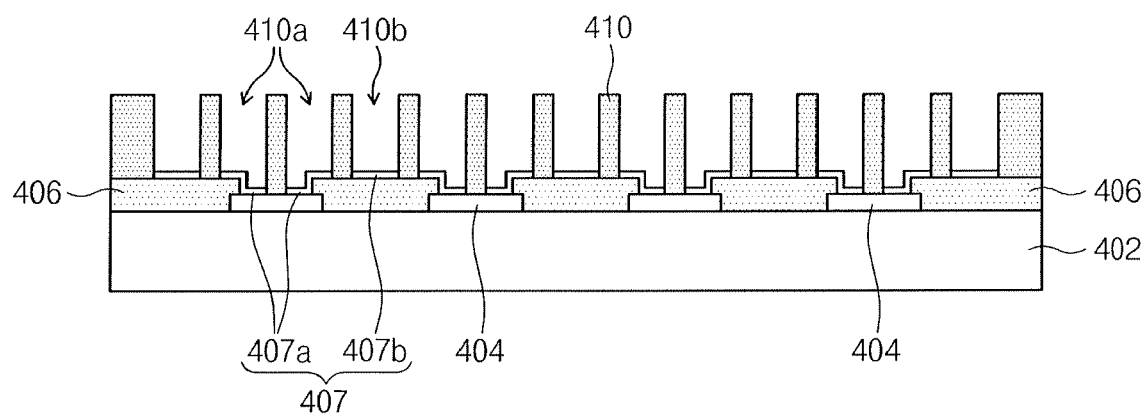

Referring to FIG. 4C, a surface activation treatment is performed to form a lower layer 407 both on an exposed bonding pad 404 and an exposed protection layer 406. The surface activation treatment forms a material that becomes a growth of nucleus of a plating layer and functions as catalyst of a plating reaction in an electroless plating process. The surface activation treatment can improve an adhesion of a plating layer to a place where a plating layer is formed (i.e., an adhesion of the plating layer to the bonding pad 404 and an adhesion of the plating layer to the protection layer 406). The plating layer can be made from a number of uniformly and densely formed plating layers with respect to the substrate 402.

Thus, it is possible to form the lower layer 407 both on the bonding pad 404 and the protection layer 406 by a surface activation treatment. For example, a metallic salt including a rare-earth metal such as palladium, gold or platinum is provided to the substrate 402 and the rare-earth metal is adhered to a surface of the bonding pad 404 and the protection layer 406 to form the lower layer 407. The lower layer 407 may be formed on inner walls of the mask pattern 410 in the openings 410a and 410b. The surface activation treatment may be performed before the mask pattern 410 is formed.

The lower layer 407 may be divided into a first lower layer 407a formed by adsorption of platinum, palladium, gold or platinum on the bonding pad 404 exposed through the first opening 410a and a second lower layer 407b formed by adsorption of platinum, palladium, gold or platinum on the protection layer 406 exposed through the second opening 410b.

Figure 4D:
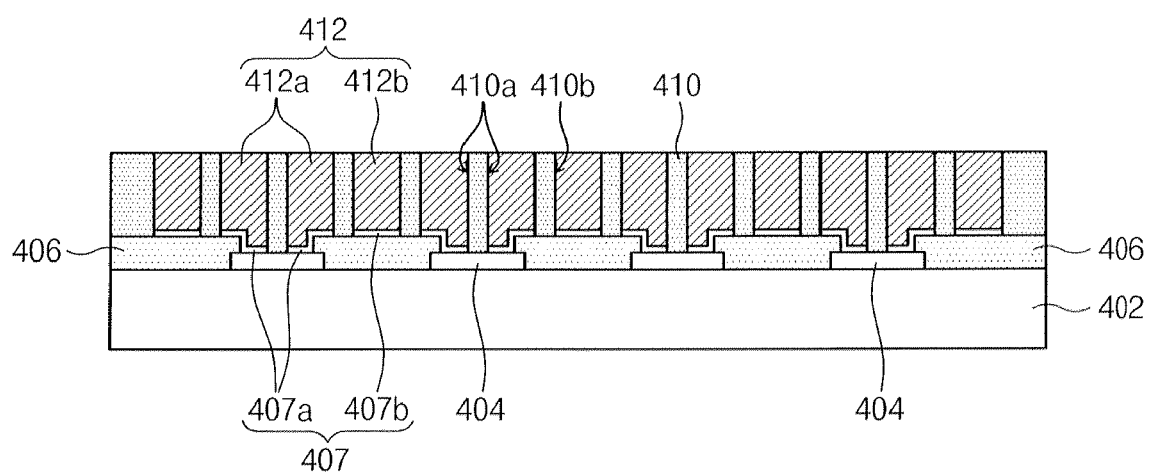

Referring to FIG. 4D, the substrate 402 is soaked in a plating solution including metal with which the substrate 402 is plated to form a plating layer 412 by an electroless plating method. The plating solution may include a metallic salt and a reducing agent. The metallic salt is a salt including a metal ion to be plated. For example, when nickel is plated using an electroless plating method, the metallic salt may include nickel chloride (e.g., $NiCl_2 6H_2O$) or nickel sulfate (e.g., $NiSO_4 6H_2O$). The reducing agent is a material that reduces a metal ion to a metal by providing an electron to a metal ion. For example, the reducing agent may include sodium hypophosphite monohydrate ($NaH_2PO_2H_2O$), borohydride or hydrazine ($N_2H_4$) in a nickel plating.

The plating layer 412 may include a first plating layer 412a which is plated on the first lower layer 407a to fill the first opening 410a and a second plating layer 412b which is plated on the second lower layer 407b to fill the second opening 410b.

Figure 4E:
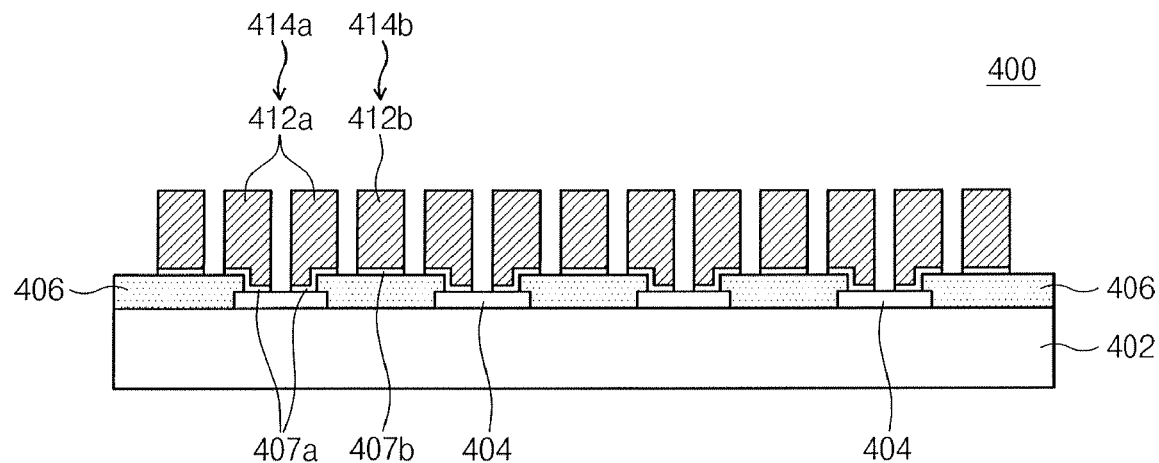

Referring to FIG. 4E, the mask pattern (410 of FIG. 4D) is removed. A semiconductor package 400 including a first bump 414a which is electrically connected to the bonding pad 404 and a second bump 414b which is not electrically connected to the bonding pad 404 may be accomplished. The first bump 414a may include the first lower layer 407a and the first plating layer 412a, and the second bump 414b may include the second lower layer 407b and the second plating layer 412b. A large number of the first and second bumps 414a and 414b are uniformly arranged with respect to an entire region of the substrate 402. The number of the first and second bumps 414a and 414b is greater than the number of the bonding pads 404.

Figure 5A:
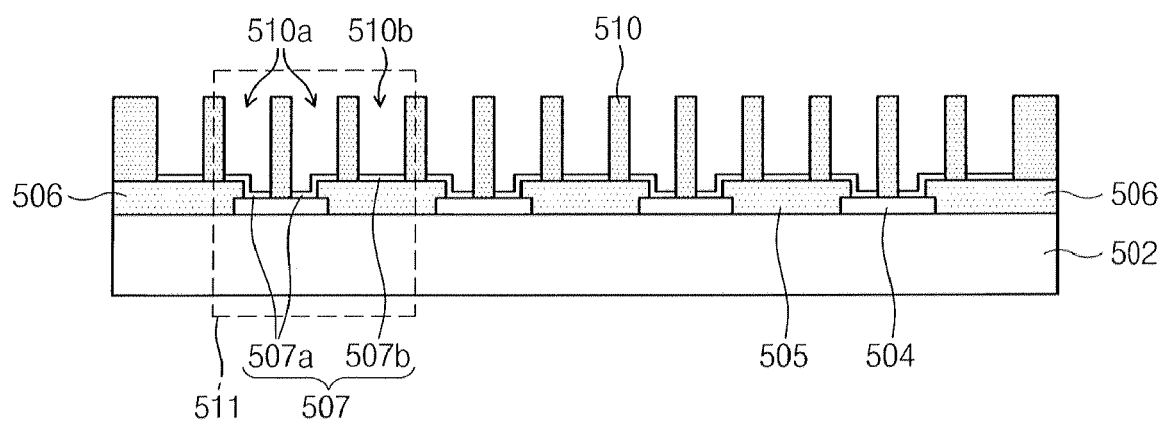
FIGS. 5A through 5C are cross sectional views illustrating a method of manufacturing a semiconductor package according to an embodiment of the present general inventive concept.
Figure 5B:
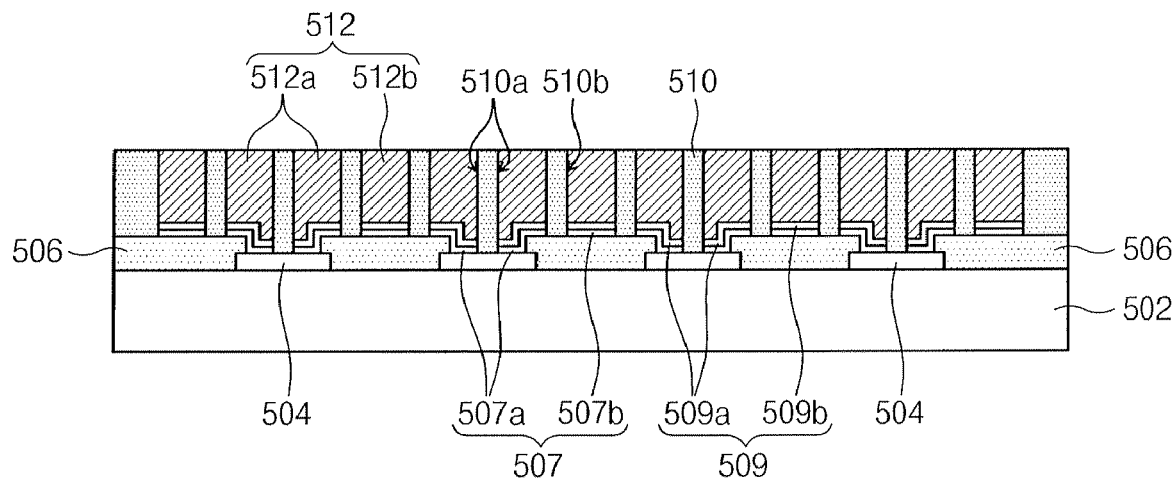
Figure 5C:
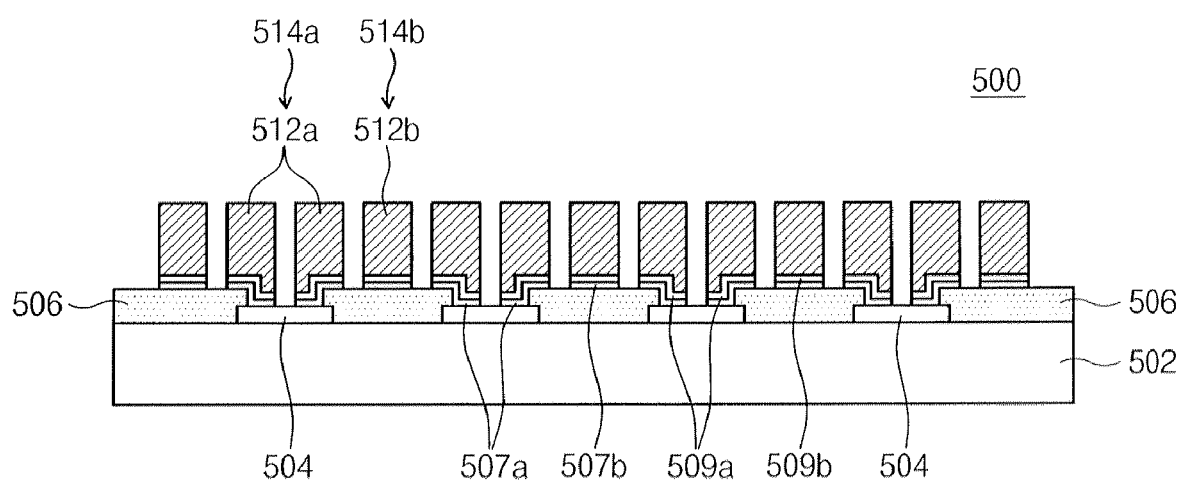

FIGS. 5A through 5C are cross sectional views illustrating a method of manufacturing a semiconductor package according to an embodiment of the present general inventive concept. The description of common features already discussed in the embodiments of FIGS. 1A through 4E will be omitted for brevity.

Referring to FIG. 5A, a mask pattern 510 that a unit pattern 511 is regularly and/or repeatedly disposed or arranged with respect to an entire region of a substrate 502 is formed on the substrate 502 including a protection layer 506 to expose at least a portion of a bonding pad 504 by performing a process identical to or similar to the process described in FIGS. 4A and 4B. For example, the unit pattern 511 may include at least two first openings 510a to expose the bonding pad 504 and at least one second opening 510b to expose the protection layer 506.

A lower layer 507 may be formed on the exposed bonding pad 504 and the protection layer 506 by identically or similarly performing a surface activation treatment. The lower layer 507 may include a first lower layer 507a formed by adsorption of platinum or palladium onto the bonding pad 504 exposed through the first opening 510a and a second lower layer 507b formed by adsorption of platinum or palladium on the protection layer 506 exposed through the second opening 510b.

Referring to FIG. 5B, a lower plating layer 509 may be formed by performing a process identical to or similar to the process described in FIG. 4D. The lower plating layer 509 may, for example, be made of nickel. The lower plating layer 509 may include a first lower plating layer 509a which is plated on the first lower layer 507a to fill at least a portion of the first opening 510a and a second lower plating layer 509b which is plated on the second lower layer 507b to fill at least a portion of the second opening 510b.

An upper plating layer 512 is formed by an electroless plating method. The upper plating layer 512 may be made of metal such as copper (Cu) or gold (Au). In one embodiment, when plating copper (Cu) using an electroless plating method, copper sulfate (II) (CuSO$_4$5H$_2$O) may be adopted as a metallic salt and paraformaldehyde, formaldehyde, borohydride or hydrazine may be adopted as a reducing agent. In another embodiment, when plating gold (Au) by an electroless plating method, KAu(CN)$_2$ or HAuCl$_4$3H$_2$O may be adopted as a metallic salt and hydrazine may be adopted as a reducing agent.

The upper plating layer 512 may include a first upper plating layer 512a which is plated on the first lower plating layer 509a to fill at least a portion of the first opening 510a and a second upper plating layer 512b which is plated on the second lower plating layer 509b to fill at least a portion of the second opening 510b.

A plating process of the electroless described above may be performed by directly substituting a nickel atom which is a component of the lower plating layer 509 with a copper atom or a gold atom which is a component of the upper plating layer 512. Thus, the lower plating layer 509 may be affected by corrosion while the upper plating layer 512 is formed. When the lower plating layer 509 is not formed, copper or gold of the upper plating layer 512 is diffused to the bonding pad 509 or even to a circuit pattern to affect an electrical characteristic of the circuit pattern. A diffusion of metal can be prevented by forming the lower plating layer 509 between the upper plating layer 512 and the bonding pad 504. That is, the lower plating layer 509 may function as a barrier or an under bump metallurgy (UBM).

Referring to FIG. 5C, the mask pattern (510 of FIG. 5B) is removed. A semiconductor package 500 including a first bump 514a which is electrically connected to the bonding pad 504 and a second bump 514b which is not electrically connected to the bonding pad 504. The first bump 514a may comprise the first lower layer 507a, the first lower plating layer 509a and the upper plating layer 512a. The second bump 514b may comprise the second lower layer 507b, the second lower plating layer 509b and the second upper plating layer 512b. A large number of the first and second bumps 514a and 514b are uniformly arranged on an entire region of the substrate 502.

FIGS. 6A through 6D are cross sectional views illustrating a method of manufacturing a semiconductor package according to an embodiment of the present general inventive concept. The description of common features already discussed in the above described embodiment will be omitted for brevity.

Figure 6A:
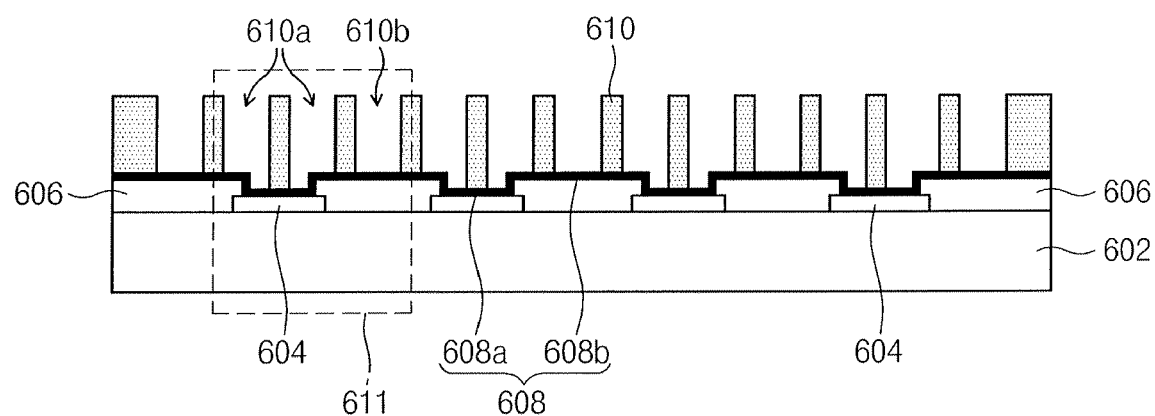
FIGS. 6A through 6D are cross sectional views illustrating a method of manufacturing a semiconductor package according to an embodiment of the present general inventive concept.

Referring to FIG. 6A, a process identical to or similar to the process described referring to FIGS. 1A through 1C is performed to form a substrate 602 including a bonding pad 604, a protection layer 606 to expose at least a portion of the bonding pad 604, and a metal layer 608 having a first metal layer 608a and a second metal layer 608b. A mask pattern 610 that a unit pattern 611 including a first opening 610a and a second opening 610b is regularly and/or repeatedly formed or distributed on an entire region of the substrate 602 may be formed on the substrate 602.

Figure 6B:
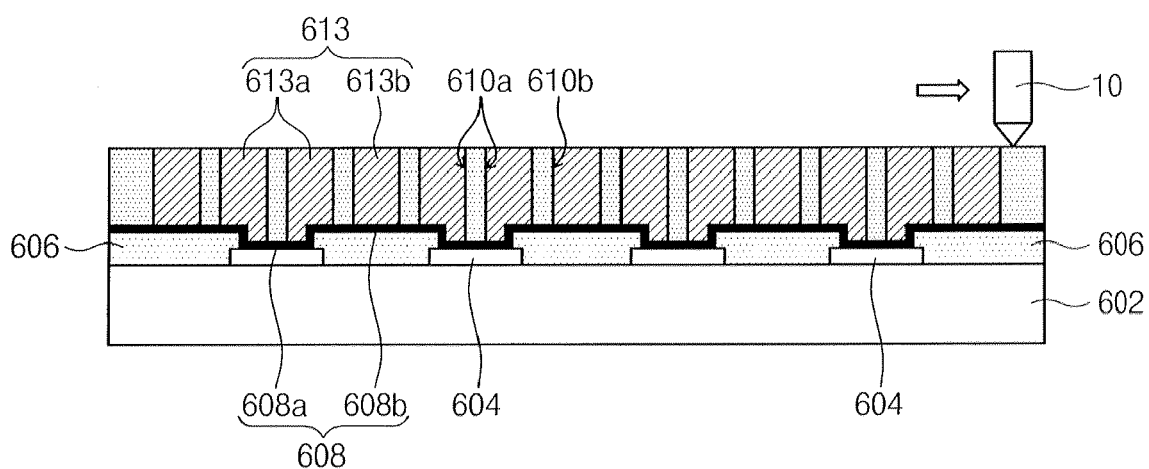

Referring to FIG. 6B, the openings 610a and 610b are filled with a metal paste 613. For example, the metal paste 613 is deposited on the mask pattern 610, and the metal paste 613 is controlled or pushed in one direction using a squeegee 10. As a result, the metal paste 613 is pressed to fill the openings 610a and 610b. The metal paste 613 may be a material that gold, silver, copper, lead, tin or an alloy powder is mixed with flux (ie., organic chemistry cream). The metal paste 613 may include a first solder paste 613a filling the first opening 610a and a second solder paste 613b filling the second opening 610b.

Figure 6C:
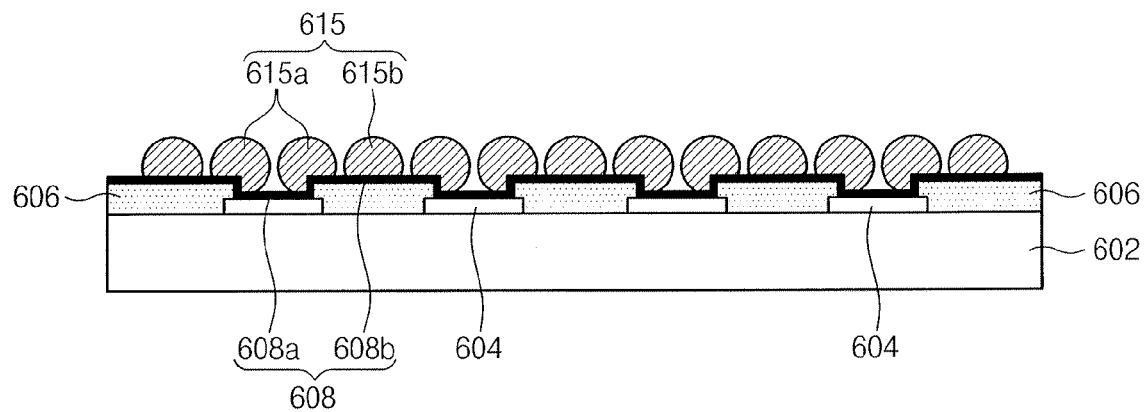

Referring to FIG. 6C, the mask pattern (610 of FIG. 6B) is removed and a reflow process may be performed. The metal paste 613 is melted to change to a liquefied state by a reflow process and to form a solder ball 615 having a spherical shape or a shape similar to the spherical shape by a surface tension. The solder ball 615 may be divided into a first solder ball 615a located on the bonding pad 604 and a second solder ball 615b located on the protection layer 606.

Figure 6D:
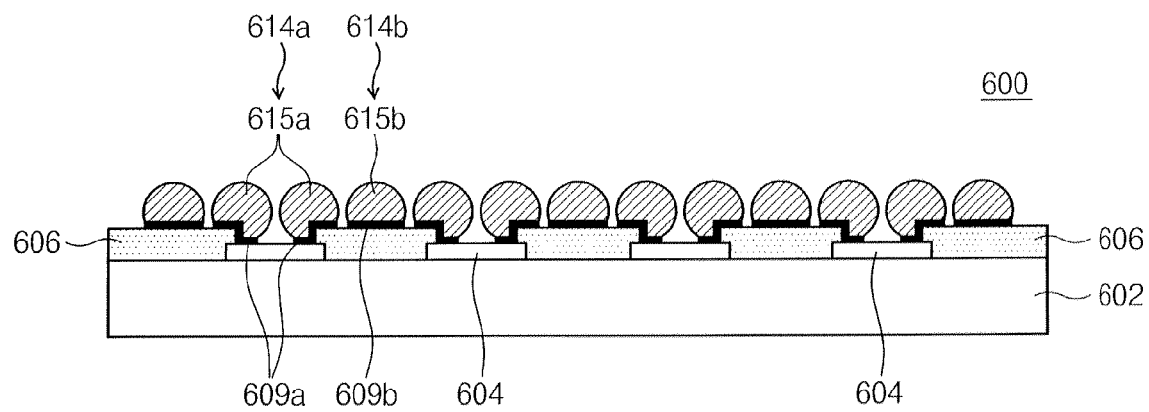

Referring to FIG. 6D, the metal layer (608 of FIG. 6C) not covered with the first and second solder balls 615a and 615b is removed by an etching process such as a wet etching or a dry etching. As a result, a first lower metal layer 609a is remained under the first solder ball 615a and a second lower metal layer 609b is remained under the second solder ball 615b. The reflow process and the etching process described above can be performed regardless of a proceeding order.

At least two first solder balls 615a are disposed to contact a bonding pad 604 through the first lower metal layer 609a. The first lower metal layer 609a include a portion formed on the bonding pad 604 and another portion extended from the portion and formed on at least a surface of the protection layer 606 disposed adjacent to the corresponding adjacent bonding pad 604. Accordingly, at least two first lower metal layers 609a can be electrically connected to the corresponding bonding pad 604 through the respective first lower metal layers 609a.

The adjacent first solder balls 615a may be spaced apart from each other with respect to the bonding pad 604 by a distance shorter than a width of the bonding pad 604 and may have a width narrower than a width of the bonding pad 604. The adjacent first solder balls 615a may be disposed over the bonding pad 604 such that an area of the bonding pad 604 may overlap corresponding areas of the respective first solder balls 615a.

A semiconductor package 600 including a first bump 614a and a second bump 614b may be manufactured through the stencil method (screen printing) described above. The first bump 614a may comprise the first solder ball 615a and the first lower metal layer 609a and the second bump 614b may comprise the second solder ball 615b and the second lower metal layer 609b. The first and second bumps 614a and 614b are uniformly distributed and densely arranged on an entire region of the substrate 602.

FIGS. 7A through 7D are cross sectional views illustrating a method of manufacturing a semiconductor package according to an embodiment of the present general inventive concept. The description of common features already discussed in the above described embodiment will be omitted for brevity.

Figure 7A:
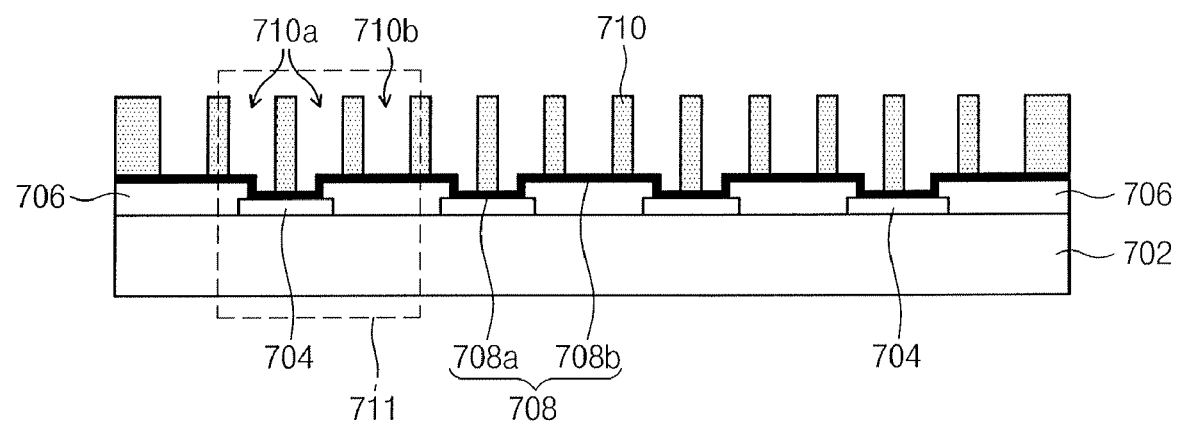
FIGS. 7A through 7D are cross sectional views illustrating a method of manufacturing a semiconductor package according to an embodiment of the present general inventive concept.

Referring to FIG. 7A, a process identical to or similar to the process described referring to FIGS. 1A through 1C is performed. A substrate 602 including a protection layer 706 exposing a portion of a bonding pad 704 and a metal layer 708 that can be divided into a first metal layer 708a and a second metal layer 708b can be provided. A mask pattern 710 that a unit pattern 711 including a first opening 710a and a second opening 710b is regularly repeated on an entire region of the substrate 702 may be formed on the substrate 702.

Figure 7B:
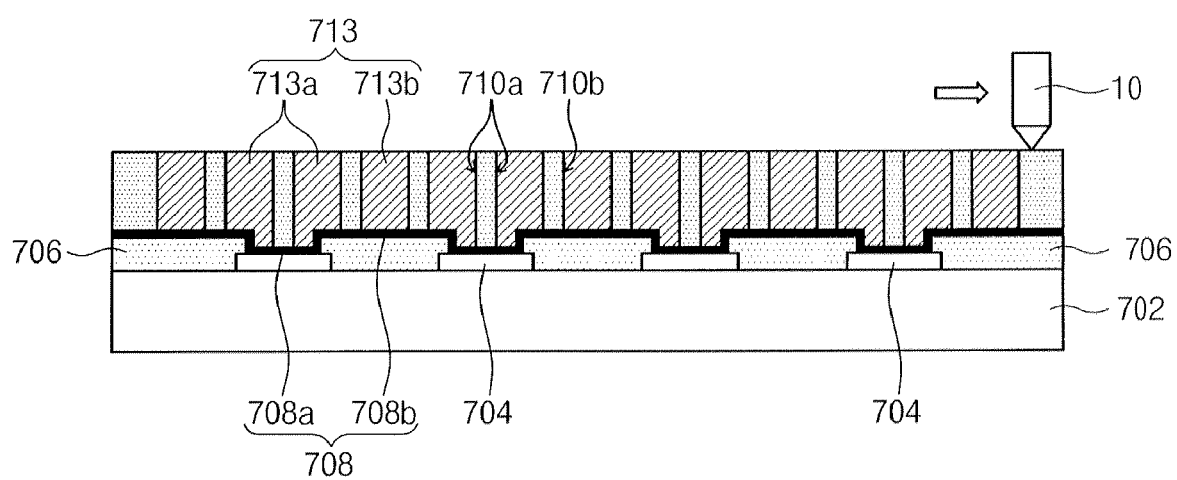

Referring to FIG. 7B, the openings 710a and 710b are filled with a metal paste 713. For example, the metal paste 713 is deposited on the mask pattern 710 and the metal paste 713 is pushed in one direction using a squeegee 10. As a result, the metal paste 713 is pressed to fill the openings 710a and 710b. The metal paste 713 may be a material that gold, silver, copper, lead, tin or an alloy powder is mixed with flux. The metal paste 713 may be divided into a first solder paste 713a filling the first opening 710a and a second solder paste 713b filling the second opening 710b. Subsequently, an annealing is applied to the substrate 702 to sinter the metal paste 713.

Figure 7C:
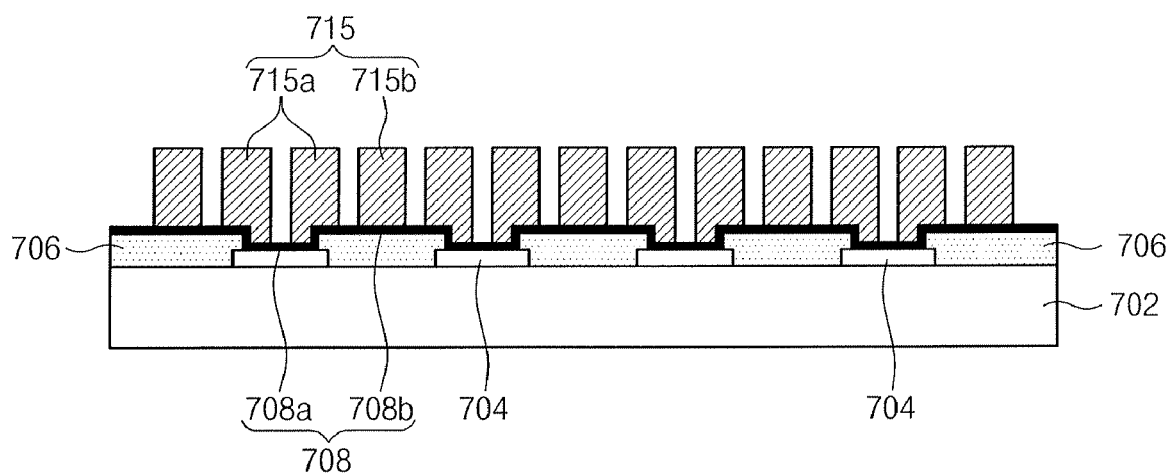

Referring to FIG. 7C, the mask pattern (710 of FIG. 7B) is removed. As a result, an upper metal layer 715 of a pillar shape is disposed on the substrate 702. A number of upper metal layer 715 are disposed over the substrate 702. The upper metal layer 715 may include a first upper metal layer 715a located on the bonding pad 704 and a second upper metal layer 715b located on the protection layer 706.

Figure 7D:
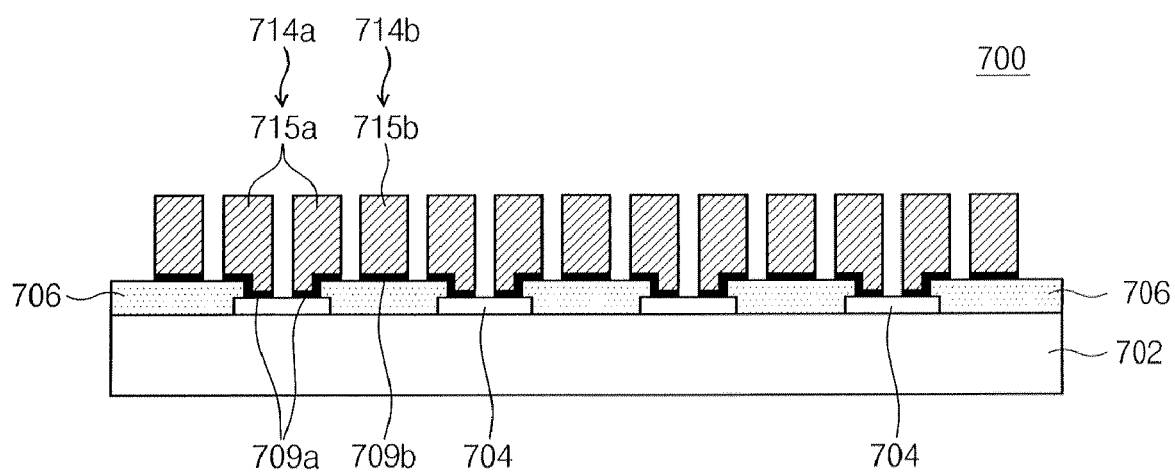

Referring to FIG. 7D, the metal layer (708 of FIG. 7C) not covered with the first and second solder balls 715a and 715b is removed by an etching process such as a wet etching or a dry etching. As a result, a first lower metal layer 709a may be remained under the first solder ball 715a and a second lower metal layer 709b may be remained under the second solder ball 715b.

A semiconductor package 700 including a first bump 714a and a second bump 714b may be manufactured through the stencil method. The first bump 714a may include the first solder ball 715a and the first lower metal layer 709a and the second bump 714b may include the second solder ball 715b and the second lower metal layer 709b. a large number of the first and second bumps 714a and 714b are uniformly distributed and arranged with respect to an entire region of the substrate 702.

Figure 8A:
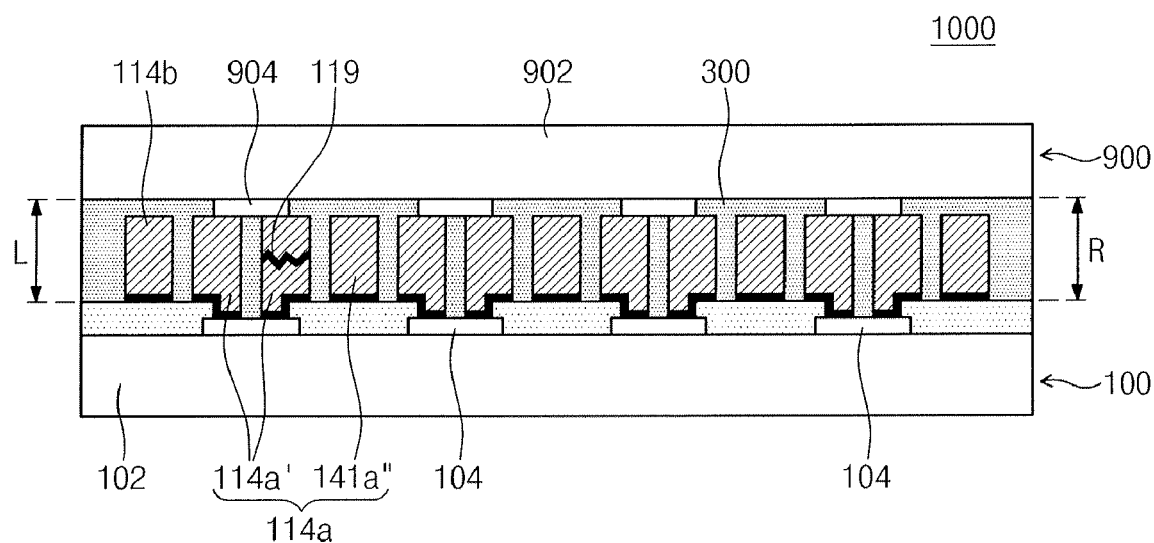
FIGS. 8A through 8C are cross sectional views illustrating an application example of a semiconductor package according to an embodiment of the present general inventive concept.
Figure 8B:
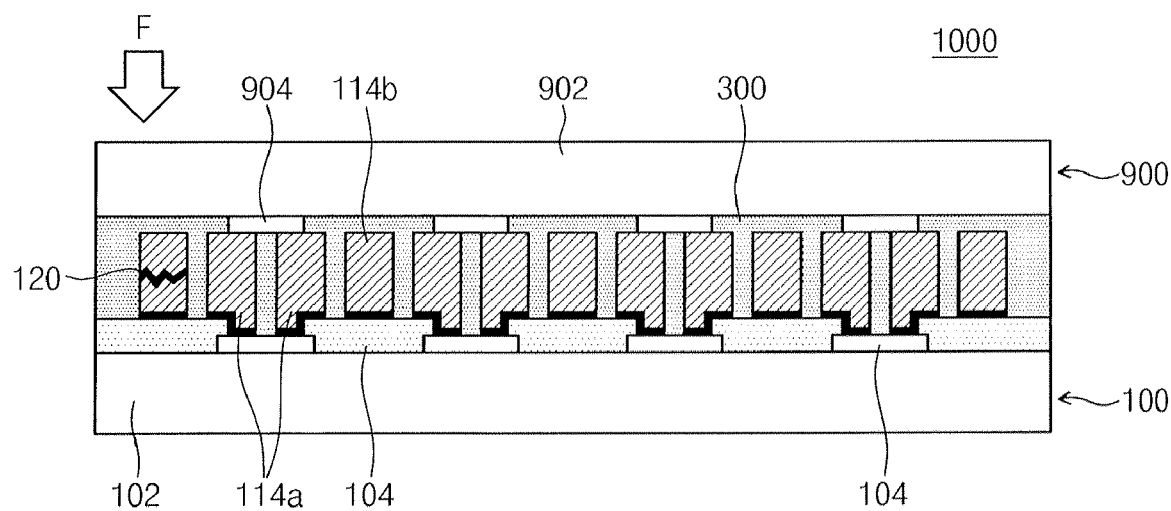
Figure 8C:
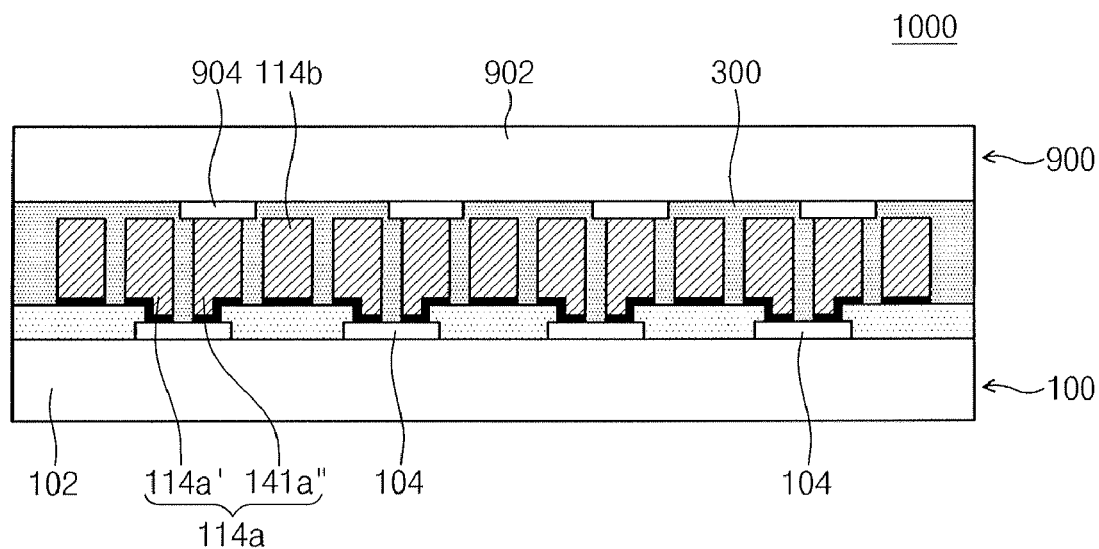

FIGS. 8A through 8C are cross sectional views illustrating an application example of a semiconductor package according to an embodiment of the present general inventive concept.

Referring to FIG. 8A, a semiconductor package 100 of the present embodiment is electrically connected to an electrical device 900 through a plurality of first bumps 114a to constitute a semiconductor package 1000 such as a multi-chip package or a flip chip package. Hereinafter, the first bump 114a include a first sub bump 114a' and a second sub bump 114a" for convenience' sake. The electrical device 900 may be a semiconductor chip or a printed circuit board including a substrate 902 where a plurality of bonding pads 904 are formed. An insulating material such as a polymer or an epoxy molding compound (EMC) is provided between a semiconductor package 100 and the electrical device 900 to form an under-filling layer 300. The semiconductor package 1000 can be molded using an epoxy molding compound (EMC). The semiconductor packages 200 through 700 of the above-described embodiments can be used as the semiconductor package 100.

The semiconductor package 100 may include one or more semiconductor chips (or one or more circuit units) and a substrate having bonding pads 104 electrically connected to the one or more semiconductor chips, and the electronic device 900 may be formed with one or more semiconductor chips (or one or more circuit units) and a substrate having bonding pads 904 electrically connected to the one or more semiconductor chips. A bonding pad 104 is electrically connected to a bonding pad 904 through a plurality of bumps 114a.

The semiconductor package 100 and the electrical device 900 of the semiconductor package 1000 may be electrically connected to each other by a plurality of the first bumps 114a. For example, the bonding pad 904 may be electrically connected to the bonding pad 104 through the first sub bump 114a' and the second sub bump 114a". When the second sub bump 114a" cannot function as an electrical connection due to a defect, for example, a crack 119, the bonding pad 904 can be electrically connected to the bonding pad 104 by the first sub bump 114a'. That is, even if one of the two of first bumps 114a cannot function as an electrical connection, the electrical connection between the bonding pad 904 and the bonding pad 104 can be maintained by the other of the two first bumps 114a.

As described referring to FIG. 1F, a plurality of bumps 114a and 114b can be uniformly arranged over an entire region of the substrate 102. Thus, the electrical device 900 can be uniformly supported by a plurality of the bumps 114a and 114b. As a result, since a gap (e.g., a bonding gap) is formed between the electrical device 900 and the semiconductor package 100 to maintain a specific value, a difference between a left gap (L) and a right gap (R) may not exist.

That is, the left gap L and the right gap R are same, and the electronic device 900 and the semiconductor package 100 can be parallel to each other. Since a large number of bumps are formed between the external device 900 and the substrate of the semiconductor package, the external device 900 can be maintained parallel to the substrate of the semiconductor package 100 due to a small number of defected bumps which cannot properly support either electronic device 900 or the semiconductor package 100 or cannot provide electrical connection between electronic device 900 and the semiconductor package 100.

If a plurality of the bumps 114a and 114b are mainly arranged on a center of the substrate 102, the electrical device 900 may be inclined to one side when performing an underfilling process or actually using an assembly of the electronic device 900 and the semiconductor package 100 by a user. For example, the electrical device 900 is inclined to the left side (i.e., L<R), an electrical connection is cut off or the electrical device 900 may be broken. For another example, when a plurality of the bumps 114a and 114b are mainly arranged on edges of the substrate 102, a center of the substrate 102 may go down or deformed with respect to the electronic device 900. As a result, since the bonding gap may not maintain a specific value, a phenomenon described above may occur. However, since a large number of bumps and/or uniformly arranged bumps can form the bonding gap of the semiconductor package 1000 of the present embodiment to maintain a specific value, a phenomenon described above may not occur.

Referring to FIG. 8B, the semiconductor package 1000 of the present embodiment can provide a proper electrical connection under a severe stress condition. For example, when force F of 10 units is applied or exerted to an edge of the semiconductor package 1000, a defect, for example, a crack 120, may occur in the second bump 114b disposed on the left side. In this case, since the second bump 114b where the crack 120 occurs is a dummy bump, the second bump 114b do not affect the electrical connection and absorbs shocks to a certain extent. Thus, since a force F which the semiconductor package 100 receives is, for example, a force F of 8 units smaller than force of 10 units, a mechanical durability of the semiconductor package 1000 may become great.

That is, a 10 unit force is exerted to the bumps, and one of the bumps is deformed or a crack is formed in the one of the bumps to absorb a 2 unit force such that a remaining force, for example, a 8 unit force, is applied or exerted to either the semiconductor package 100 or the external device 900.

Referring to FIG. 8C, even though a misalign between the bonding pad 904 and the bonding pad 104 occurs, so that the first sub bump 114' cannot perform an electrical connection function, an electrical connection between the bonding pad 904 and the bonding pad 104 can be maintained by the second sub bump 114a''.

Figure 9B:
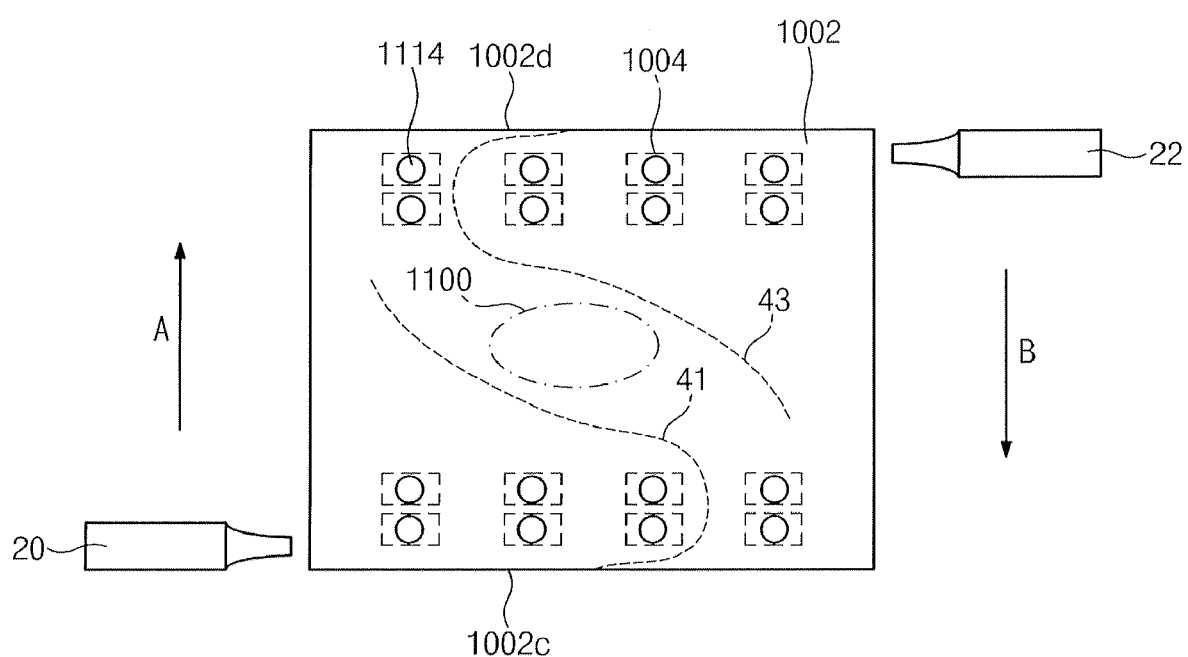
FIG. 9B is a top plane view of a general under-filling process.

FIGS. 9A and 9B are top plane view illustrating an ease of an under-filling process. FIG. 9A is a top plane view of an under-filling process according to an embodiment of the present invention. FIG. 9B is a top plane view of a general under-filling process.

Referring to FIG. 9A, an under-filling layer (300 of FIG. 8A) of the semiconductor package 1000 may be formed by disposing a first unit (first syringe) 20 on one side edge 102a of the substrate 102 to throw up a polymer from the first syringe 20 to the substrate 102. At this time, the first syringe 20 can throw up the polymer while moving in "A" direction. A second unit (second syringe) 22 is disposed on the opposite side edge 102b of the substrate 102 to eject a polymer from the second syringe 22 to the substrate 102a while moving in a "B" direction so as to maximize an efficiency of the under-filling process.

In the under-filling process, the polymer ejected from the first syringe 20 may be spread out on an entire region of the substrate 102 at a comparatively high speed. This is because a large number of the bumps 114a and 114b are uniformly arranged on an entire region of the substrate 102 regardless of an arrangement of the bonding pad 104, and a capillary phenomenon which may occur between the bumps 114a and 114b and may occur on an entire region of the substrate 102. Similarly, the polymer ejected from the second syringe 22 may be spread out on an entire region of the substrate 102 at a comparatively high speed. A speed of a polymer ejected from the first syringe 20 may be indicated by a first line 40 and a speed of a polymer ejected from the second syringe 22 may be indicated by a second line 42.

Referring to FIG. 9B, when a plurality of bonding pads 1004 are mainly disposed on an edge of a substrate 1002 and a plurality of bumps 1114 are mainly disposed on an edge of the substrate 1002 so as to correspond with an arrangement of the bonding pad 1004, a speed of a polymer may be different. For example, a speed of a polymer thrown up from the first syringe 20 may become slow as the polymer goes to an upper edge 1002d of the substrate 1002 from a lower edge 1002c of the substrate 1002 as known from a shape of a first line 41. Accordingly, a void 1100 may generate in a center portion of the substrate 1002 that is not filled with a polymer.

However, as illustrated in FIG. 9A, since a speed of a polymer is uniform on an entire region of the substrate 102 in the semiconductor package 1000 of the present embodiment to fill all spaces between the substrate 102 and the substrate 902 with a polymer, there is no room for generation of a void.

Figure 10:
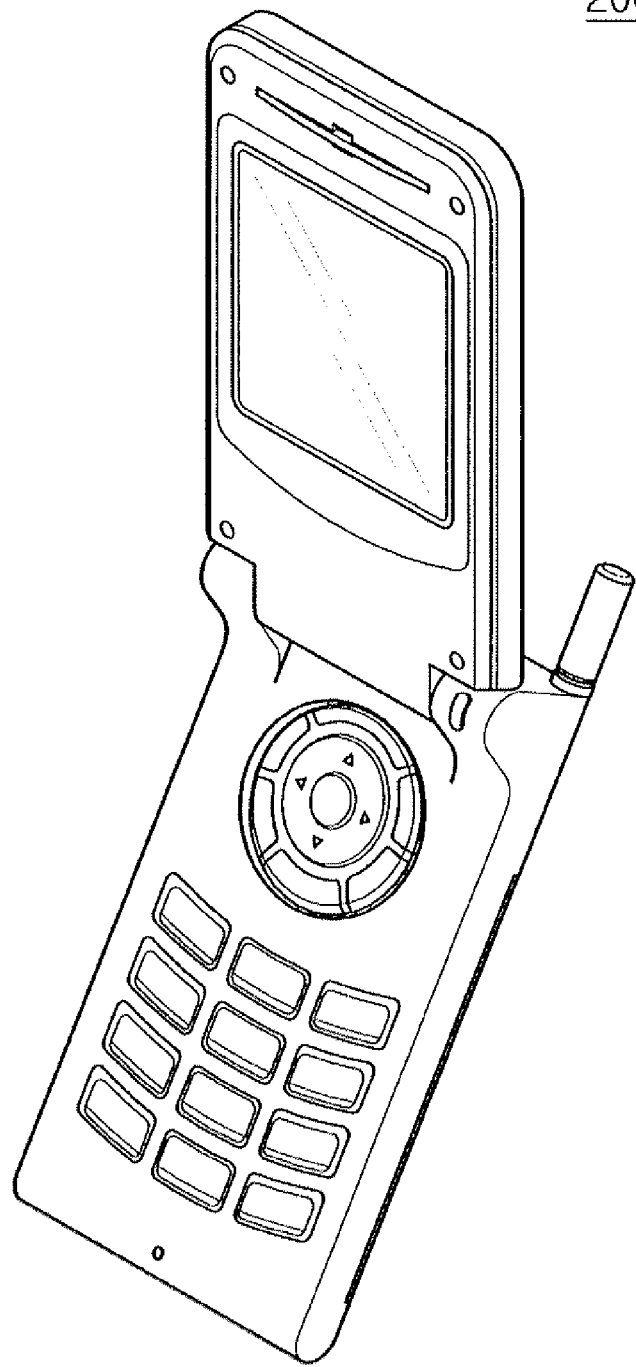
FIG. 10 is a perspective view of an electronic device including a semiconductor package according to an embodiment of the present general inventive concept.

FIG. 10 is a perspective view of an electronic device including a semiconductor package according to an embodiment of the present general inventive concept.

Referring to FIG. 10, a semiconductor package according to the present embodiments can be applied to an electronic apparatus, such as a cell phone 2000. Since an electrical reliability and a mechanical durability of a semiconductor package of the present embodiment can be improved, the semiconductor package can guarantee reliability of an operation under a severe condition that a physical shock is applied to a cell phone 2000. An electronic apparatus having a semiconductor package of the present embodiments is not limited to a cell phone 2000 and may include a mobile electronic apparatus, a notebook computer, a personal multimedia player (PMP), an MP3 player, a camcorder, a memory stick, a memory card and so on.

Figure 11:
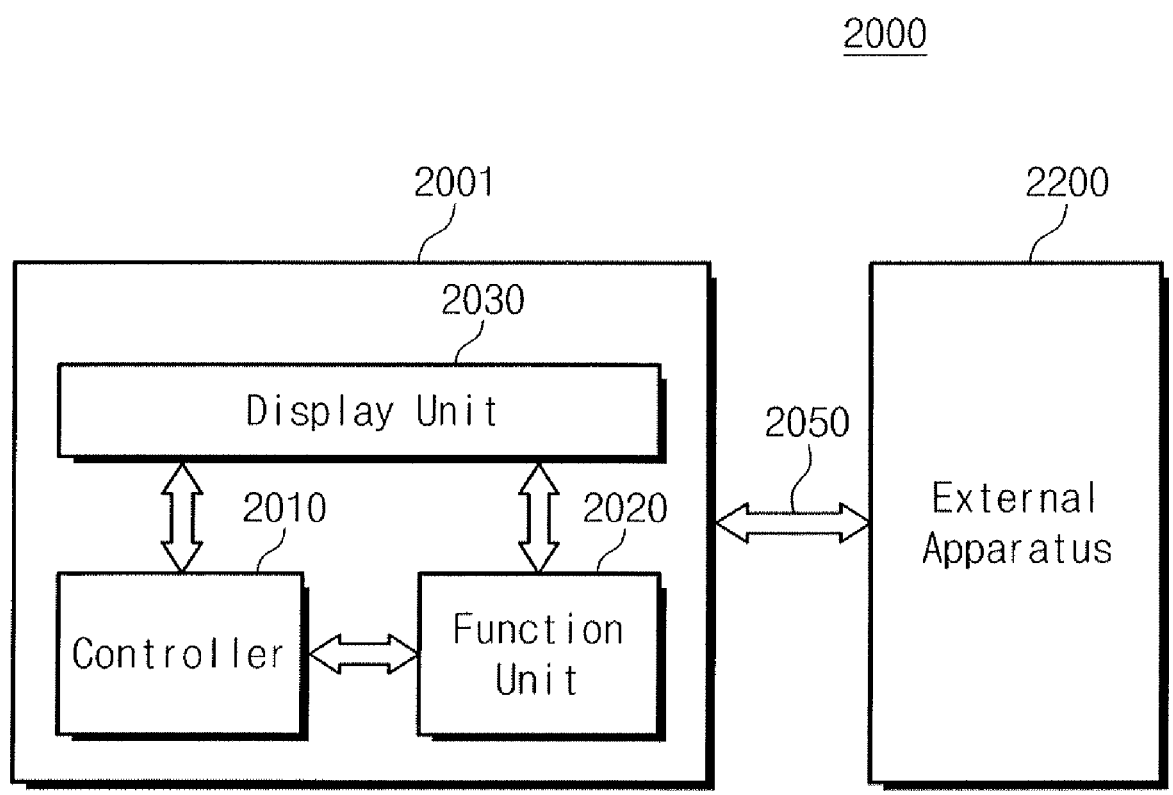
FIG. 11 is a block diagram illustrating the electronic apparatus 2000 of FIG. 10.

FIG. 11 is a block diagram illustrating the electronic apparatus 2000 of FIG. 10. The electronic apparatus 2000 may include a body 2001, a controller 2010, a function unit 2020, and a display unit 2030. The controller 2010, function unit 2020, and the display unit 2030 may be formed in an inside of the body 2001 or on a surface of the body 2001. The display unit 2030 may be disposed on the surface of the body 2001 to display an image processed by the controller 2010 or the function unit 2020.

The controller 2010 controls the function unit 2020 and the display unit 2030. The function unit 2020 performs a function of the electronic apparatus 2000. For example, when the electronic apparatus 2000 is a cell phone, the function unit 2020 may include elements to perform a cell phone function, such as dialing, communicating with an external apparatus 2200 to transmit and receive signals corresponding to data, video image, and/or audio signals, processing the signals, generating signals to be output to the display unit 2030 and a speaker (terminal) to generate an image and sound, respectively. The function unit 2020 may communicate with the external apparatus 2000 through a wired or wireless communication unit 2050. The semiconductor package 1000 can be used in at least one of the controller 2010 and the function unit 2020. The bumps formed on the substrate 100 can be connected to bonding pads of an element of the controller 2010 or the function unit 2020. The controller 2010 or the function unit 2020 may require at least one memory unit or processing unit. In this case, the semiconductor package 1000 can be used as the memory unit or processing unit of the controller 2010 and/or the function unit 2020.

The foregoing is illustrative of the present invention and is not to be construed as limiting thereof. Although a few embodiments of the present general inventive concept have been described, those skilled in the art will readily appreciate that many modifications are possible in the embodiments without materially departing from the novel teachings and advantages of the present general inventive concept. Accordingly, all such modifications are intended to be included within the scope of the present general inventive concept as defined in the claims. Therefore, it is to be understood that the foregoing is illustrative of the present general inventive concept and is not to be construed as limited to the specific embodiments disclosed, and that modifications to the disclosed embodiments, as well as other embodiments, are intended to be included within the scope of the appended claims. The present general inventive concept is defined by the following claims, with equivalents of the claims to be included therein.

What is claimed is:

1. A semiconductor package comprising:
    a substrate including a plurality of pads, the pads having a pitch therebetween;
    a protection layer formed on the substrate and having a plurality of openings to expose the pads at a height lower than a height of the protection layer, the openings having central axes; and
    a plurality of bumps uniformly disposed at a pitch on an entire region of the substrate regardless of an arrangement of the plurality of pads, the bumps having central axes such that two adjacent first bumps of the plurality of bumps are electrically connected to a pad at the lower height of the pad and at least one of the two adjacent first bumps overlaps and extends beyond a width of the pad and overlaps the protection layer,
    wherein the pitch between the bumps is smaller than the pitch between the pads, and
    wherein a central axis of at least one of the bumps disposed within an opening that exposes a pad is not aligned with a central axis of the opening.

2. The semiconductor package of claim 1, wherein the plurality of the bumps comprises:
    a plurality of first bumps electrically connected to the plurality of pads; and
    a plurality of second bumps not electrically connected to the plurality of pads.

3. The semiconductor package of claim 2, wherein the plurality of the first and second bumps are uniformly disposed on an entire region of the substrate at regular pitches.

4. The semiconductor package of claim 3, wherein at least two adjacent first bumps of the plurality of the first bumps are electrically connected to the pad.

5. The semiconductor package of claim 4, wherein:
    the substrate further comprises a protection layer exposing a portion of the pad; and
    the at least two adjacent first bumps are located on the pad and the second bump is located on the protection layer.

6. The semiconductor package of claim 1, wherein each of the plurality of the first and second bumps comprises a lower metal layer and a first metal layer provided on the lower metal layer.

7. The semiconductor package of claim 6, wherein each of the plurality of the first and second bumps further comprises a second metal layer on the first metal layer.

8. The semiconductor package of claim 7, wherein the first metal layer comprises a spherical shape or a pillar shape.

9. The semiconductor package of claim 6, wherein the lower metal layer comprises a barrier layer to prevent a metal atom included in the first metal layer from being diffused to the pad.

10. The semiconductor package of claim 1, wherein pairs of bumps of the plurality of bumps have a combined width that is wider than the width of the pads.

11. A semiconductor package comprising:
    a substrate including a plurality of pads;
    a protection layer formed on the substrate and having a plurality of openings to expose the plurality of pads at a height lower than a height of the protection layer; and
    a plurality of bumps uniformly disposed on an entire region of the substrate, the plurality of bumps comprising:
        a plurality of first bumps electrically connected to the plurality of pads; and
        a plurality of second bumps not electrically connected to the plurality of pads,
        wherein two adjacent first bumps of the plurality of first bumps are electrically connected to a pad at the lower height of the pad, and
        wherein at least one of the two adjacent first bumps overlaps and extends beyond a width of the pad and overlaps the protection layer.

12. The semiconductor device of claim 11, wherein the two adjacent first bumps partially overlap the bend-pad and partially overlap the protection layer.

13. A semiconductor package comprising:
    a substrate including at least one pad;
    a protection layer formed on the substrate and having a plurality of openings to expose the at least one pad; and
    a plurality of bumps uniformly disposed at a uniform pitch on an entire region of the substrate, the plurality of bumps including pairs of adjacent bumps making direct electrical contact with the at least one pad and overlapping an adjacent portion of the protection layer,
    wherein a portion of the plurality of bumps are uniformly disposed in a length direction and a width direction on the at least one pad.

14. The semiconductor package of claim 13, wherein the plurality of bumps include a 3×3 grid uniformly disposed in a length direction and a width direction on the at least one pad.

15. The semiconductor package of claim 13, wherein a pitch between adjacent bumps is the same distance as a diameter of the bumps.

16. A semiconductor package comprising:
    a substrate including a plurality of pads disposed within a plurality of openings of a protection layer, the plurality of openings having central axes;
    a plurality of pairs of bumps uniformly disposed on an entire region of the substrate;
    an electrical device mounted above the plurality of pairs of bumps, the plurality-pairs of bumps having central axes that are positioned off-center from the central axes of the openings; and
    a plurality of second pads connected to the pairs of bumps to establish electrical connection between the substrate and the electrical device,
    wherein the plurality of pairs of bumps include:
        a plurality of first bumps electrically connected to the plurality of pads, two adjacent first bumps partially overlapping the pad and partially overlapping the protection layer; and
        a plurality of second bumps not electrically connected to the plurality of pads.

17. The semiconductor package of claim 16,
wherein the pads have center axes and the second pads have center axes, and
wherein the center axes of the second pads are aligned with the center axes of the pads and the second pads are electrically connected to the plurality of pairs of bumps.

18. The semiconductor package of claim 16,
wherein the pads have center axes and the second pads have center axes, and
wherein the center axes of the second pads are misaligned with the center axes of the pads and the second pads are connected to only one of the bumps of the pair of bumps.

19. A semiconductor package comprising:
a substrate including a plurality of pads;
a protection layer formed on the substrate and having a plurality of openings to expose the pads;
a plurality of pairs of bumps uniformly disposed on an entire region of the substrate, each pair of bumps partially overlapping the pad to be electrically connected to the pad and partially overlapping an adjacent portion of the protection layer;
an electrical device mounted above the plurality of pairs of bumps; and
a plurality of second pads connected to the pairs of bumps to establish electrical connection between the substrate and the electrical device,
wherein the pads have center axes and the second pads have center axes, and the center axes of the second pads are misaligned with the center axes of the pads and the second pads are connected to only one of the bumps of the pair of bumps.

* * * * *